(12) United States Patent
Pilliod et al.

(10) Patent No.: US 10,937,915 B2
(45) Date of Patent: Mar. 2, 2021

(54) OBSCURING, COLOR MATCHING, AND CAMOUFLAGING SOLAR PANELS

(71) Applicant: Tesla, Inc., Palo Alto, CA (US)

(72) Inventors: Michael Pilliod, Los Angeles, CA (US); Christos Gougoussis, Cupertino, CA (US); Michael M. Laurin, San Pedro, CA (US); Scott Tandoi, San Francisco, CA (US); Javier Verdura, Rancho Palos Verdes, CA (US); Franz Von Holzhausen, Malibu, CA (US); Caroline Park, Los Angelges, CA (US); Radu Muntean, Los Angeles, CA (US); Kate Kuzina, Long Beach, CA (US); Dante Lamastra, Corona, CA (US)

(73) Assignee: Tesla, Inc., Palo Alto, CA (US)

( * ) Notice: Subject to any disclaimer, the term of this patent is extended or adjusted under 35 U.S.C. 154(b) by 153 days.

(21) Appl. No.: 15/796,683

(22) Filed: Oct. 27, 2017

(65) Prior Publication Data
US 2018/0122973 A1   May 3, 2018

Related U.S. Application Data

(60) Provisional application No. 62/414,275, filed on Oct. 28, 2016, provisional application No. 62/450,000, (Continued)

(51) Int. Cl.
*H01L 31/0463* (2014.01)
*H01L 31/048* (2014.01)
(Continued)

(52) U.S. Cl.
CPC .... *H01L 31/0463* (2014.12); *H01L 31/02366* (2013.01); *H01L 31/048* (2013.01);
(Continued)

(58) Field of Classification Search
CPC .......... H01L 31/0463; H01L 31/02366; H01L 31/048; H02S 20/23
See application file for complete search history.

(56) References Cited

U.S. PATENT DOCUMENTS

| 2,354,091 A | 7/1944 | Sharpe et al. |
| 3,076,861 A | 2/1963 | Samulon et al. |

(Continued)

FOREIGN PATENT DOCUMENTS

| CN | 101531468 A | 9/2009 |
| CN | 203871349 U | 10/2014 |

(Continued)

OTHER PUBLICATIONS

Bulucani et al., "A New Approach: Low Cost Masking Material and Efficient Copper Metallization for Higher Efficiency Silicon Solar Cells", IEEE, 2015, 6 pages.
(Continued)

*Primary Examiner* — Tae-Sik Kang
(74) *Attorney, Agent, or Firm* — Dentons US LLP

(57) ABSTRACT

A solar panel includes a backsheet layer, a bottom encapsulant layer adjacent the backsheet layer, a plurality of photovoltaic cells adjacent the bottom encapsulant layer, a top encapsulant layer adjacent the plurality of photovoltaic cells having a plurality of louvers constructed therein to block side view of the plurality of photovoltaic cells, and a top layer adjacent the top encapsulant layer.

8 Claims, 34 Drawing Sheets

Related U.S. Application Data filed on Jan. 24, 2017, provisional application No. 62/452,221, filed on Jan. 30, 2017, provisional application No. 62/452,269, filed on Jan. 30, 2017.

(51) Int. Cl.

| | | |
|---|---|---|
| *H01L 31/0236* | (2006.01) | |
| *H02S 20/23* | (2014.01) | |
| *H02S 40/20* | (2014.01) | |
| *H02S 20/25* | (2014.01) | |
| *H01L 31/054* | (2014.01) | |
| *H02S 20/00* | (2014.01) | |

(52) U.S. Cl.
CPC .......... *H01L 31/0547* (2014.12); *H02S 20/00* (2013.01); *H02S 20/23* (2014.12); *H02S 20/25* (2014.12); *H02S 40/20* (2014.12); *Y02B 10/10* (2013.01); *Y02E 10/50* (2013.01)

(56) References Cited

U.S. PATENT DOCUMENTS

| | | |
|---|---|---|
| 3,369,939 A | 2/1968 | Myer |
| 3,461,602 A | 8/1969 | Hasel et al. |
| 4,239,810 A | 12/1980 | Alameddine et al. |
| 4,379,944 A | 4/1983 | Borden et al. |
| 4,724,011 A | 2/1988 | Turner et al. |
| 5,118,540 A | 6/1992 | Hutchison |
| 5,338,369 A | 8/1994 | Rawlings |
| 5,427,961 A | 6/1995 | Takenouchi et al. |
| 5,667,596 A | 9/1997 | Tsuzuki et al. |
| 5,942,048 A | 8/1999 | Fujisaki et al. |
| 5,942,331 A | 8/1999 | Miyauchi et al. |
| 6,133,522 A | 10/2000 | Kataoka et al. |
| 6,222,117 B1 | 4/2001 | Shiozaki |
| 6,311,436 B1 | 11/2001 | Mimura et al. |
| 6,365,824 B1 | 4/2002 | Nakazima et al. |
| 6,472,594 B1 | 10/2002 | Ichinose et al. |
| 6,528,716 B2 | 3/2003 | Collette et al. |
| 6,586,271 B2 | 7/2003 | Hanoka |
| 6,960,716 B2 | 11/2005 | Matsumi et al. |
| 7,259,321 B2 | 8/2007 | Oswald et al. |
| 7,276,724 B2 | 10/2007 | Sheats et al. |
| 7,506,477 B2 | 3/2009 | Flaherty et al. |
| 7,534,956 B2 | 5/2009 | Kataoka et al. |
| 7,772,484 B2 | 8/2010 | Li et al. |
| 7,833,808 B2 | 11/2010 | Xu et al. |
| 7,851,700 B2 | 12/2010 | Luch |
| 7,858,874 B2 | 12/2010 | Ruskin et al. |
| 7,902,451 B2 | 3/2011 | Shimizu |
| 7,964,440 B2 | 6/2011 | Salleo et al. |
| 8,124,437 B2 | 2/2012 | Huang et al. |
| 8,148,194 B2 | 4/2012 | Fujii et al. |
| 8,205,400 B2 | 6/2012 | Allen |
| 8,206,664 B2 | 6/2012 | Lin |
| 8,276,329 B2 | 10/2012 | Lenox |
| 8,402,653 B2 | 3/2013 | Daniel et al. |
| 8,471,141 B2 | 6/2013 | Stancel et al. |
| 8,664,030 B2 | 3/2014 | Luch |
| 8,674,209 B2 | 3/2014 | Hong et al. |
| 8,674,377 B2 | 3/2014 | Farquhar |
| 8,701,360 B2 | 4/2014 | Ressler |
| 8,713,861 B2 | 5/2014 | Desloover |
| 8,741,160 B2 | 6/2014 | Kim |
| 8,822,810 B2 | 9/2014 | Luch |
| 8,916,019 B2 | 12/2014 | Suga et al. |
| 9,038,330 B2 | 5/2015 | Bellavia |
| 9,054,240 B2 | 6/2015 | Kim et al. |
| 9,150,966 B2 | 10/2015 | Xu et al. |
| 9,206,520 B2 | 12/2015 | Barr et al. |
| 9,343,592 B2 | 5/2016 | Hunt |
| 9,362,527 B2 | 6/2016 | Takemura |
| 9,368,665 B2 | 6/2016 | Fukumochi et al. |
| 9,412,884 B2 | 8/2016 | Heng et al. |
| 9,525,092 B2 | 12/2016 | Mayer et al. |
| 9,825,582 B2 | 11/2017 | Fernandes et al. |
| 9,899,554 B2 | 2/2018 | Yang et al. |
| 9,966,487 B2 | 5/2018 | Magnusdottir et al. |
| 2001/0054435 A1 | 12/2001 | Nagao et al. |
| 2002/0015782 A1 | 2/2002 | Abys et al. |
| 2003/0098059 A1 | 5/2003 | Hanoka |
| 2003/0180983 A1 | 9/2003 | Oswald et al. |
| 2004/0229394 A1 | 11/2004 | Yamada et al. |
| 2004/0261840 A1 | 12/2004 | Schmit et al. |
| 2005/0039788 A1 | 2/2005 | Blieske et al. |
| 2005/0268963 A1 | 12/2005 | Jordan et al. |
| 2006/0048798 A1 | 3/2006 | Mccoy et al. |
| 2006/0086620 A1 | 4/2006 | Chase et al. |
| 2006/0204730 A1 | 9/2006 | Nakamura et al. |
| 2008/0135085 A1 | 6/2008 | Corrales et al. |
| 2008/0178928 A1 | 7/2008 | Warfield et al. |
| 2008/0223436 A1 | 9/2008 | Den et al. |
| 2009/0101192 A1 | 4/2009 | Kothari et al. |
| 2009/0120497 A1 | 5/2009 | Schetty, III |
| 2009/0133739 A1 | 5/2009 | Shiao et al. |
| 2009/0133740 A1 | 5/2009 | Shiao et al. |
| 2009/0183764 A1 | 7/2009 | Meyer |
| 2009/0233083 A1 | 9/2009 | Inoue et al. |
| 2009/0242021 A1 | 10/2009 | Petkie et al. |
| 2009/0287446 A1 | 11/2009 | Wang et al. |
| 2009/0308435 A1 | 12/2009 | Caiger |
| 2010/0000603 A1 | 1/2010 | Tsuzuki et al. |
| 2010/0006147 A1 | 1/2010 | Nakashima et al. |
| 2010/0018568 A1 | 1/2010 | Nakata |
| 2010/0132762 A1 | 6/2010 | Graham et al. |
| 2010/0147363 A1 | 6/2010 | Huang et al. |
| 2010/0154868 A1 | 6/2010 | Kourtakis et al. |
| 2010/0180929 A1 | 7/2010 | Raymond et al. |
| 2010/0252107 A1 | 10/2010 | Suga |
| 2010/0326522 A1 | 12/2010 | Okaniwa |
| 2011/0023282 A1 | 2/2011 | Daniel et al. |
| 2011/0023937 A1* | 2/2011 | Daniel ............... E04F 10/08 136/246 |
| 2011/0023942 A1 | 2/2011 | Soegding et al. |
| 2011/0030761 A1 | 2/2011 | Kalkanoglu et al. |
| 2011/0100418 A1 | 5/2011 | Maeda et al. |
| 2011/0220195 A1 | 9/2011 | Moronaga et al. |
| 2011/0240095 A1 | 10/2011 | Murillo-Mora et al. |
| 2011/0277818 A1* | 11/2011 | Shimura ............ H01G 9/2068 136/246 |
| 2011/0277825 A1 | 11/2011 | Fu et al. |
| 2012/0012162 A1 | 1/2012 | Kobayashi |
| 2012/0012741 A1 | 1/2012 | Vasylyev |
| 2012/0031470 A1 | 2/2012 | Dimov et al. |
| 2012/0048349 A1 | 3/2012 | Metin et al. |
| 2012/0060911 A1 | 3/2012 | Fu et al. |
| 2012/0125391 A1 | 5/2012 | Pinarbasi et al. |
| 2012/0199184 A1 | 8/2012 | Nie et al. |
| 2012/0229911 A1 | 9/2012 | Rodriguez-Parada et al. |
| 2012/0237670 A1 | 9/2012 | Lim et al. |
| 2013/0025675 A1 | 1/2013 | Lee |
| 2013/0048057 A1 | 2/2013 | Kalkanoglu et al. |
| 2013/0048062 A1 | 2/2013 | Min et al. |
| 2013/0048072 A1 | 2/2013 | Choi |
| 2013/0061913 A1 | 3/2013 | Willham et al. |
| 2013/0160823 A1 | 6/2013 | Khouri et al. |
| 2013/0196140 A1 | 8/2013 | Lewis et al. |
| 2013/0206213 A1 | 8/2013 | He et al. |
| 2013/0209776 A1 | 8/2013 | Kim |
| 2013/0233378 A1 | 9/2013 | Moslehi et al. |
| 2013/0247959 A1 | 9/2013 | Kwon et al. |
| 2013/0255755 A1 | 10/2013 | Chich |
| 2013/0276876 A1 | 10/2013 | Kerkar et al. |
| 2013/0280521 A1 | 10/2013 | Mori |
| 2014/0034109 A1 | 2/2014 | Kim et al. |
| 2014/0120699 A1 | 5/2014 | Hua et al. |
| 2014/0124014 A1 | 5/2014 | Morad et al. |
| 2014/0130866 A1 | 5/2014 | Yoshimine et al. |
| 2014/0144487 A1* | 5/2014 | Kim .................... H01L 31/0481 136/251 |
| 2014/0196768 A1 | 7/2014 | Heng et al. |
| 2014/0216549 A1 | 8/2014 | Satoh et al. |
| 2014/0313574 A1 | 10/2014 | Bills et al. |
| 2014/0360582 A1 | 12/2014 | Cui et al. |

(56) References Cited

U.S. PATENT DOCUMENTS

| | | |
|---|---|---|
| 2015/0090314 A1 | 4/2015 | Yang et al. |
| 2015/0155824 A1 | 6/2015 | Chien |
| 2015/0162475 A1 | 6/2015 | Lee et al. |
| 2015/0194552 A1 | 7/2015 | Ogasahara et al. |
| 2015/0243931 A1 | 8/2015 | Fukuura |
| 2015/0270410 A1 | 9/2015 | Heng et al. |
| 2015/0349145 A1 | 12/2015 | Morad et al. |
| 2015/0349152 A1 | 12/2015 | Voss et al. |
| 2015/0349703 A1 | 12/2015 | Morad et al. |
| 2016/0013329 A1 | 1/2016 | Brophy et al. |
| 2016/0105144 A1 | 4/2016 | Haynes et al. |
| 2016/0163902 A1 | 6/2016 | Podlowski |
| 2016/0181446 A1 | 6/2016 | Kalkanoglu et al. |
| 2016/0223729 A1 | 8/2016 | Medwick et al. |
| 2016/0225931 A1 | 8/2016 | Heng et al. |
| 2017/0033250 A1 | 2/2017 | Ballif et al. |
| 2017/0077343 A1 | 3/2017 | Morad et al. |
| 2017/0194516 A1 | 7/2017 | Reddy et al. |
| 2017/0222082 A1 | 8/2017 | Lin et al. |
| 2018/0130921 A1 | 5/2018 | Mayer et al. |
| 2018/0166601 A1 | 6/2018 | Inaba |
| 2018/0269824 A1 | 9/2018 | Mayer et al. |

FOREIGN PATENT DOCUMENTS

| | | |
|---|---|---|
| CN | 204216062 U | 3/2015 |
| CN | 102544380 B | 8/2015 |
| CN | 103426957 B | 3/2016 |
| CN | 102956730 B | 6/2016 |
| DE | 102007054124 A1 | 5/2009 |
| EP | 1058320 A2 | 12/2000 |
| EP | 1329433 A1 | 7/2003 |
| EP | 2051124 A2 | 4/2009 |
| EP | 2410575 A2 | 1/2012 |
| EP | 2709160 A1 | 3/2014 |
| GB | 2278618 A | 12/1994 |
| JP | 57-141979 A | 9/1982 |
| JP | 60-20586 A | 2/1985 |
| JP | 6-140657 A | 5/1994 |
| JP | 6-264571 A | 9/1994 |
| JP | 2000-91610 A | 3/2000 |
| JP | 2000-216415 A | 8/2000 |
| JP | 2000-323740 A | 11/2000 |
| JP | 2001-119054 A | 4/2001 |
| JP | 2005-41120 A | 2/2005 |
| JP | 2010-199439 A | 9/2010 |
| JP | 2010-245275 A | 10/2010 |
| JP | 2013-211385 A | 10/2013 |
| JP | 2014-36130 A | 2/2014 |
| WO | 2008/136872 A2 | 11/2008 |
| WO | 2009/062106 A1 | 5/2009 |
| WO | 2009/099418 A2 | 8/2009 |
| WO | 2009/134208 A1 | 11/2009 |
| WO | 2010/128375 A2 | 11/2010 |
| WO | 2011/128757 A1 | 10/2011 |
| WO | 2012/133973 A1 | 10/2012 |
| WO | 2013/059441 A1 | 4/2013 |
| WO | 2013/067541 A1 | 5/2013 |
| WO | 2013/102181 A1 | 7/2013 |
| WO | 2014/178180 A1 | 11/2014 |
| WO | 2015/155356 A1 | 10/2015 |
| WO | 2016/090341 A1 | 6/2016 |

OTHER PUBLICATIONS

Extended Search Report received for European Patent Application No. 17865516.3, dated May 28, 2020, 7 pages.

Fan et al., "Laser Micromachined Wax-Covered Plastic Paper as Both Sputter Deposition Shadow Masks and Deep-Ultraviolet Patterning Masks for Polymethylmacrylate-Based Microfluidic Systems", vol. 12, No. 4, Journal of Micro/ Nanolithography, MEMS, and MOEMS, Oct. 2013, pp. 1-6.

Final Office Action received for U.S. Appl. No. 15/807,480, dated Jul. 9, 2020, 25 pages.

Final Office Action received for U.S. Appl. No. 15/924,842, dated Sep. 6, 2019, 11 pages.

International Preliminary Report on Patentability received for PCT Patent Application No. PCT/US2017/059115, dated May 9, 2019, 11 pages.

International Preliminary Report on Patentability received for PCT Patent Application No. PCT/US2017/060858, dated May 23, 2019, 11 pages.

International Search Report and Written Opinion received for PCT Patent Application No. PCT/US2017/059115, dated Jan. 29, 2018, 12 pages.

International Search Report and Written Opinion received for PCT Patent Application No. PCT/US2017/060858, dated Apr. 4, 2018, 15 pages.

Invitation to Pay Additional Fee received for PCT Patent Application No. PCT/US2017/060858, dated Feb. 9, 2018, 12 pages.

Non-Final Office Action received for U.S. Appl. No. 15/807,480, dated Sep. 18, 2019, 16 pages.

Non-Final Office Action received for U.S. Appl. No. 15/924,842, dated Jan. 28, 2019, 8 pages.

"Optical Constant of SiO2 (Silicon dioxxide, Silica, Quartz), Refractive Index of Si02 (Silicon dioxide, Silica, Quartz)—Kischkat", Online Available at:—<https://refractiveindex.info/?shelf=main&book=SiO2&page=Kischkat>, retrieved on Sep. 1, 2019, 3 pages.

"Optical Constants of Plastics", Refractive Index of PLASTICS—pmma, Online available at:—<https://refractiveindex.info/?shelf=3d&book=plastics&page=pmma>, retrieved on Sep. 1, 2019, 2 pages.

Pelisset et al., "Efficiency of Silicon Thin-Film Photovoltaic Modules with a Front Coloured Glass", Proceeding of the CISBAT International Conference, 2011, 6 pages.

Poole et al., "Recovery Act: Organic Coatings as Encapsulants for Low Cost, High Performance PV Modules", Final Technical Report, PPG Industries Inc., Nov. 16, 2011, 35 pages.

Vyas et al., "An Inorganic/Organic Hybrid Coating for Low Cost Metal Mounted Dye-Sensitized Solar Cells", 223rd ECS Meeting, The Electrochemical Society, 2013, 1 page.

* cited by examiner

Assessment 8-10 High Res. Photos. 1min Flight

Geo-tagged Pictures -> Point Cloud

Data Generation
Roof Type + Condition

Area + Features

Roff Pitch

Geographical

Street Vantage Point

OBSCURING, COLOR MATCHING, AND CAMOUFLAGING SOLAR PANELS

CROSS-REFERENCE TO RELATED APPLICATIONS

This application claims priority to the following U.S. provisional patent applications: U.S. provisional patent application No. 62/414,275, titled "Obscuring Solar Arrays From Certain Viewing Angles," filed on Oct. 28, 2016; U.S. provisional patent application No. 62/450,000, titled "Coated Backsheet for Solar Panels," filed Jan. 24, 2017; U.S. provisional patent application No. 62/452,221, titled "Solar Cell Camouflage Structures," filed Jan. 30, 2017; and U.S. provisional patent application No. 62/452,269, titled "Solar Cell Camouflage Structures," filed Jan. 30, 2017, the content of each of these applications is hereby incorporated by reference in its entirety for all purposes

BACKGROUND

Technical Field

The present disclosure relates to solar panels; and more particularly to techniques for obscuring solar panels from certain sight lines or vantage points, color matching a backsheet of a solar panel with the cell of the panel, and camouflaging solar panels.

Description Of Related Art

Today, most of the electrical power generated that is used to light and heat homes and buildings is derived from coal, petroleum, hydro electric dams, nuclear power, wind power, ocean current power and so forth. The electrical power is generated at a power plant by utility companies and delivered to end users via transmission lines and distribution lines. The electrical power is distributed within homes and businesses at usable voltages.

Most currently used techniques for generating electrical power have a fuel cost. All facilities for generating electrical power have a facility cost. Further, the cost of transmission and distribution lines is substantial. Power loss during transmission of the electrical power from the power plants to the end users can be substantial. As electrical power consumption continues to increase additional facilities must be constructed to service the increase in demand.

Fossil fuels, such as petroleum and coal that produce most electrical energy are non-renewable. The price of these natural resources continues to increase. In cases of hydro electric power generation, the available electric output depends entirely upon natural circumstances such as rain fall. For instance, during years when rainfall is low, power generation is also low, which affects the entire community who use this source of electrical power. Wind power is typically only available during daylight hours and fluctuates both seasonally and based upon local weather patterns. In the case of nuclear power, the technology is expensive, construction of power generating stations is expensive, and nuclear hazards cannot entirely be ruled out, in spite of extensive safeguards. Nuclear power generation is not available in many regions of the world because of security concerns.

In addition, adverse environmental effects from all of these power generation methods is enormous. In other words, each of these power generation methods has its own adverse environmental effects such as hydro electric dams adversely affecting bio-diversity and possibly causing floods of enormous destruction should a dam burst. The wind power generation takes huge amounts of land and may be aesthetically unpleasant. Coal and petroleum generation causes environmental degradation in the form of carbon dioxide and toxic emissions, causing enormous adverse effects on natural weather cycles, having damaging effects on life as a whole in the planet, in the long run. Similarly, nuclear waste can be hazardous; disposing nuclear waste is very expensive and also has the ability to have an adverse effect on the environment.

Solar panels, also referred to as photovoltaic panels, typically include a relatively large number of photovoltaic cells to convert solar energy directly to electrical energy. This electrical energy is used in place of electrical energy generated from other sources and is used to power homes and businesses. Solar panels are often times deployed in arrays and electrically coupled together to produce a combined electrical output. The solar arrays are often coupled to banks of batteries and coupled to the electrical grid via an inverter. Excess electrical energy produced by an array of solar panels is fed back into the utility electrical grid and transmitted to other users.

DETAILED DESCRIPTION OF THE DISCLOSURE

A number of design tradeoffs exist for solar panels. It is beneficial for the solar panels to be efficient, inexpensive, and aesthetically pleasing, because they are installed in arrays. These arrays of solar panels may be considered eye-sores by some observers. Residential solar arrays, for example, are often mounted upon the roofs of homes and other buildings. When mounted on the roofs of homes, the solar panels mount parallel to the roofs. While this type of mounting technique is cost effective, the photovoltaic cells of the solar panels are visible to persons viewing the home or other structure, causing an unsightly appearance to the home, detracting from the aesthetics of the home. Such unsightly appearance may also violate restrictive covenants in some neighborhoods. Thus, it is desirable for the solar panels to have the appearance of roofing material with same/similar color to shingles. Further, it is desirable for the solar panels to have uniform perceived color across their areas and otherwise be visually appealing. The disclosure below provides various techniques for improving the aesthetics and performance of solar panels.

1. Obscuring Solar Arrays From Certain Viewing Angles

Figure 1:
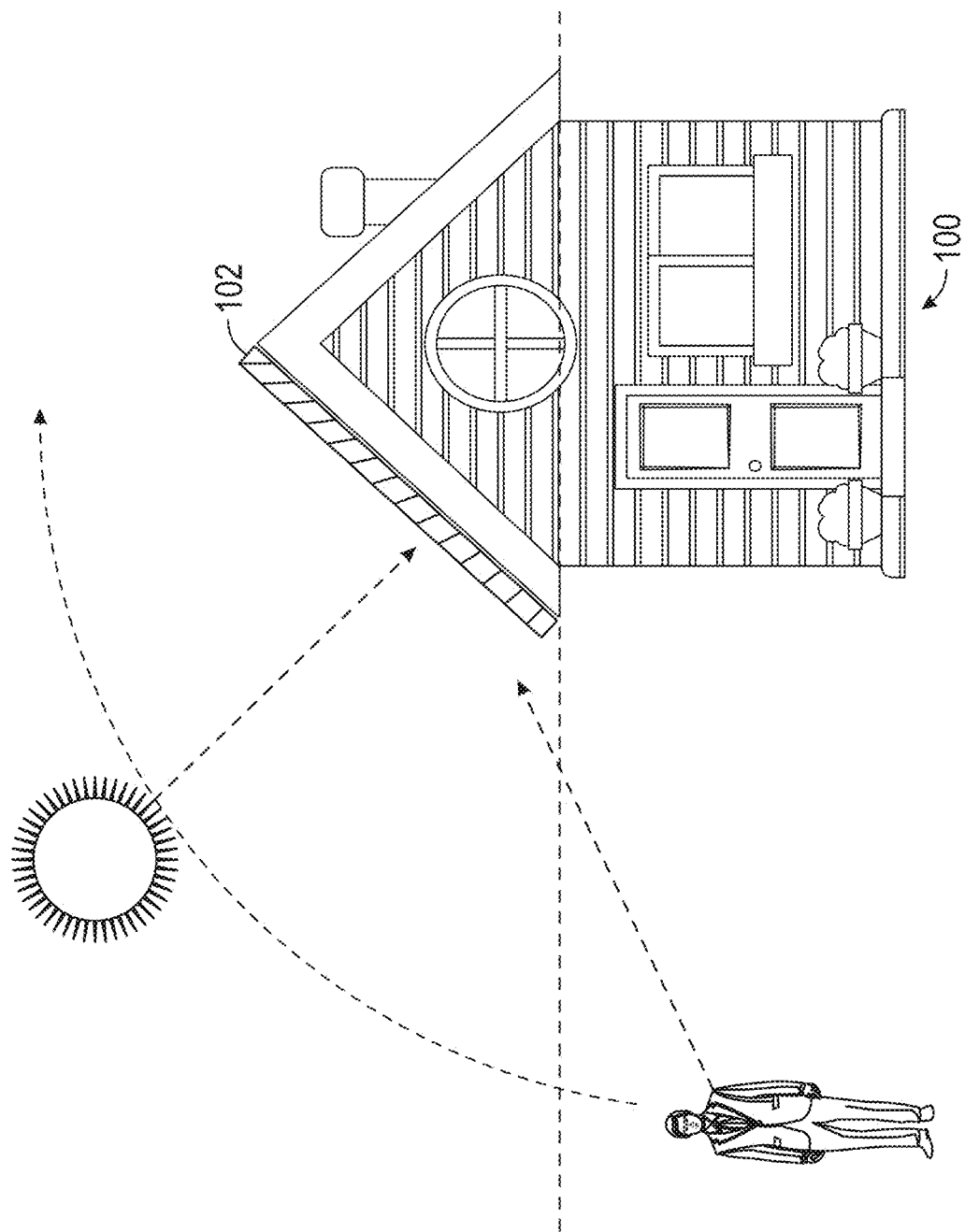
FIG. 1 is a diagram illustrating the relationship between a solar panel mounted on an angled roof of a dwelling, a pedestrian observer, and the sun.

FIG. 1 is a diagram illustrating the relationship between a solar panel 102 (or solar panel array) mounted on an angled roof of a dwelling, a pedestrian observer, and the sun. As illustrated and generally known, it is desired to have the solar panel 102 perpendicular to the angle of incidence of the solar rays coming from the sun to maximize captured solar energy and convert the captured solar energy to electrical energy. A pedestrian observer of the solar array 102 may judge the solar panel 102 unsightly. Further, the view of the solar panel 102 may violate restrictive covenants or detract from the aesthetic qualities of the home or other structure upon which the solar panel 102 mounts.

Thus, according to some embodiments, the solar panel 102 has a construct that helps to obscure the solar panel 102 from being viewed by the pedestrian observer. In the construct of the solar panel 102, the solar panel 102 includes one or more louver layers. The structure of such a solar panel will be described further with reference to FIG. 3. The louver layer of the solar panel causes the solar panel to have a substantially or fully solid color when viewed at a side angle, such as the side angle of the pedestrian observer of FIG. 1. That is, the louver layer helps to obscure the solar panel or solar cell from view along certain sight lines. The louver layer optionally includes a film that contains the louvers.

Figure 2:
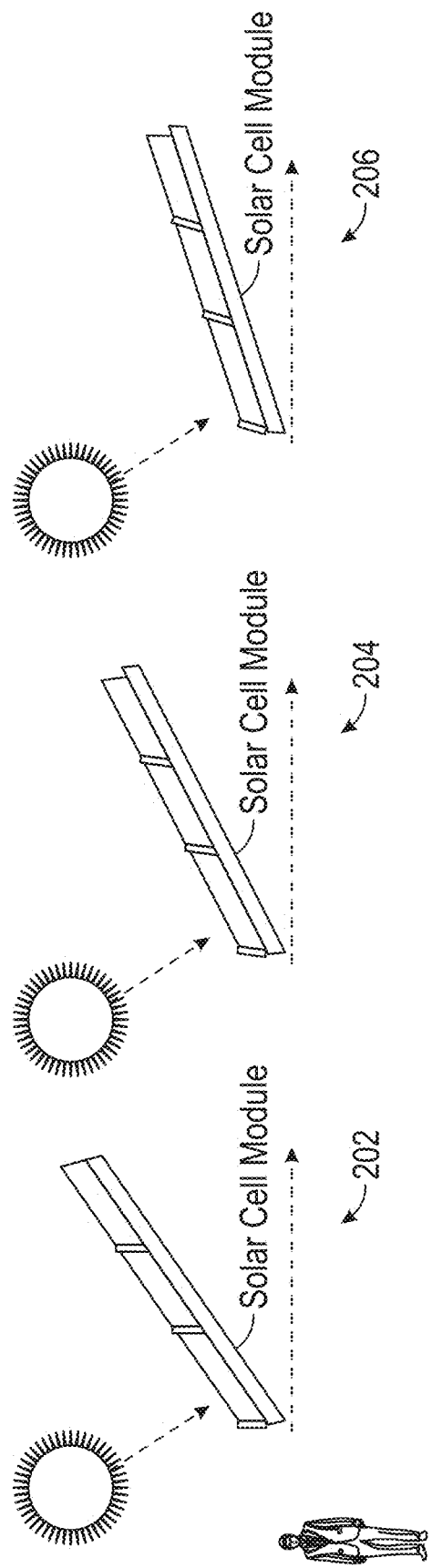
FIG. 2 is a diagram illustrating various angles of solar panel arrays at differing angles of orientation with respect to a horizontal reference.

FIG. 2 is a diagram illustrating various angles of solar panel arrays at differing angles of orientation with respect to a horizontal reference. Each of the solar panels 202, 204, and 206 mounts at a differing angle with respect to the sun and the pedestrian observer illustrated in FIG. 2. According to some embodiments, the design and construction of the louvers of the solar panels 202, 204 and 206 are based upon the angle(s) of mounting of the solar panels 202, 204, and 206. Examples of the design and construction process for such solar panels 202, 204, and 206 will be described further herein with respect to subsequent figures.

Figure 3:
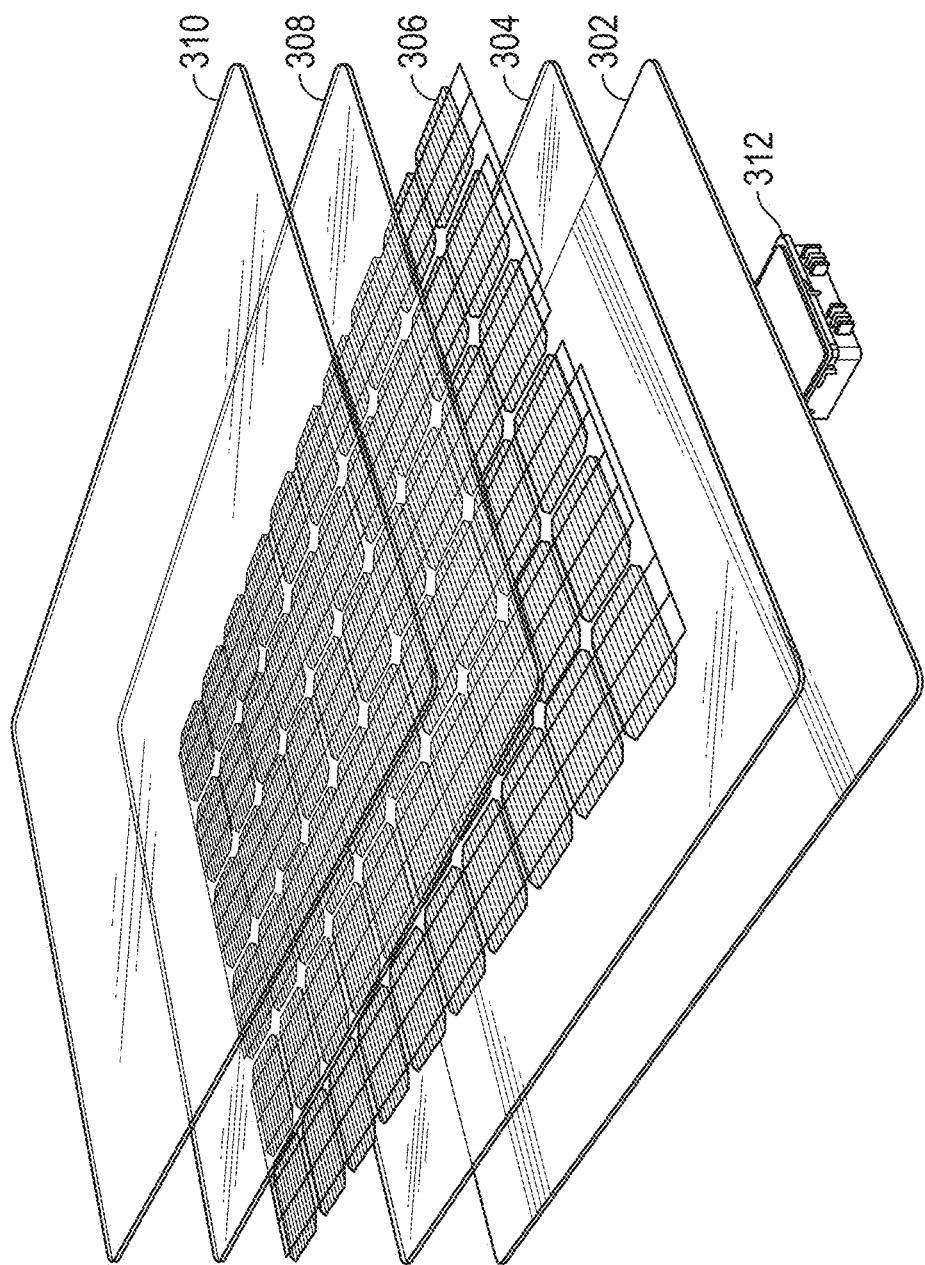
FIG. 3 is an exploded view of a solar panel constructed according to one or more embodiments.

FIG. 3 is an exploded view of a solar panel 300 constructed according to some embodiments. The solar panel 300 includes a backsheet layer 302, a bottom encapsulant layer 304 adjacent the backsheet layer 302, a plurality of photovoltaic cells 306 adjacent the bottom encapsulant layer 304, a top encapsulant layer 308 adjacent the plurality of photovoltaic cells 306 having a plurality of louvers constructed therein to block side view of the plurality of photovoltaic cells 306, and a top layer 310 adjacent the top encapsulant layer 308.

In some embodiments, the backsheet layer 302 is constructed of glass or a barrier film. The bottom encapsulant layer 304 may be constructed of Ethylene-vinyl acetate (EVA), also known as poly(ethylene-vinyl acetate) (PEVA), which is the copolymer of ethylene and vinyl acetate. The photovoltaic cells 306 may be of conventional construct. In some embodiments, the top encapsulant layer 308 is a formed structure of EVA that includes the louvers. The top layer 310 may be constructed of glass that is textured, toughed, having low iron content and of a thickness sufficient to protect the solar panel 300 underlying components. The encapsulant layers can also be polyolefin encapsulant such as 3M Solar Encapsulant Film P08100N.

The top encapsulant layer 308 may include a plurality of louvers distributed across its area. The plurality of louvers may include differing incident angles across the top encapsulant layer 308. Further, in some embodiments, a first group of the plurality of louvers have a first incident angle and a second group of the plurality of louvers have a second incident angle that differs from the first incident angle. In other constructs, the louvers have a number of differing incident angles. As will be described further herein, the louvers are designed to provide viewing obstruction to the photovoltaic cells 306 when viewed from a side angle but to minimally impede solar energy passed to the photovoltaic cells 306.

The plurality of louvers may have a design color that causes the solar panel to have the appearance of the design color when viewed from a side angle, thereby obscuring the solar panel from view. Further, with this construct, the solar panel may have the design color when viewed from the side angle and a differing color when viewed from other than the side angle.

With the embodiments of the solar panel described herein, it is desired to increase the angle transparency of the louvers for solar efficiency but to have the solar panel have the appearance of a solid color from a side angle. Various colors may be used, including gray tones from dark to light, earth tones, cedar color or appearance, and a print appearance. Thus, the top encapsulant layer 308 that includes the louvers may be constructed not only to cause the appearance of a particular color or colors from the side viewing angle but also a particular pattern or design.

According to some aspects of the present disclosure, the solar panel 300 may include a small vertical wall to further obscure view of the photovoltaic cells 306 when viewed from the side. Further, the top layer 310 may have a textured surface (textured glass), for example, in a saw tooth pattern. This saw tooth pattern may include a vertical wall on each tooth that assists in obscuring the view of a covered photovoltaic panel from a low viewing angle. Examples of this structure are illustrated further in FIGS. 15A-15D. The solar panel 300 may also include electronics or an electrical connector for coupling the solar panel 300 to other solar panels or to other electrical connections.

Figure 4:
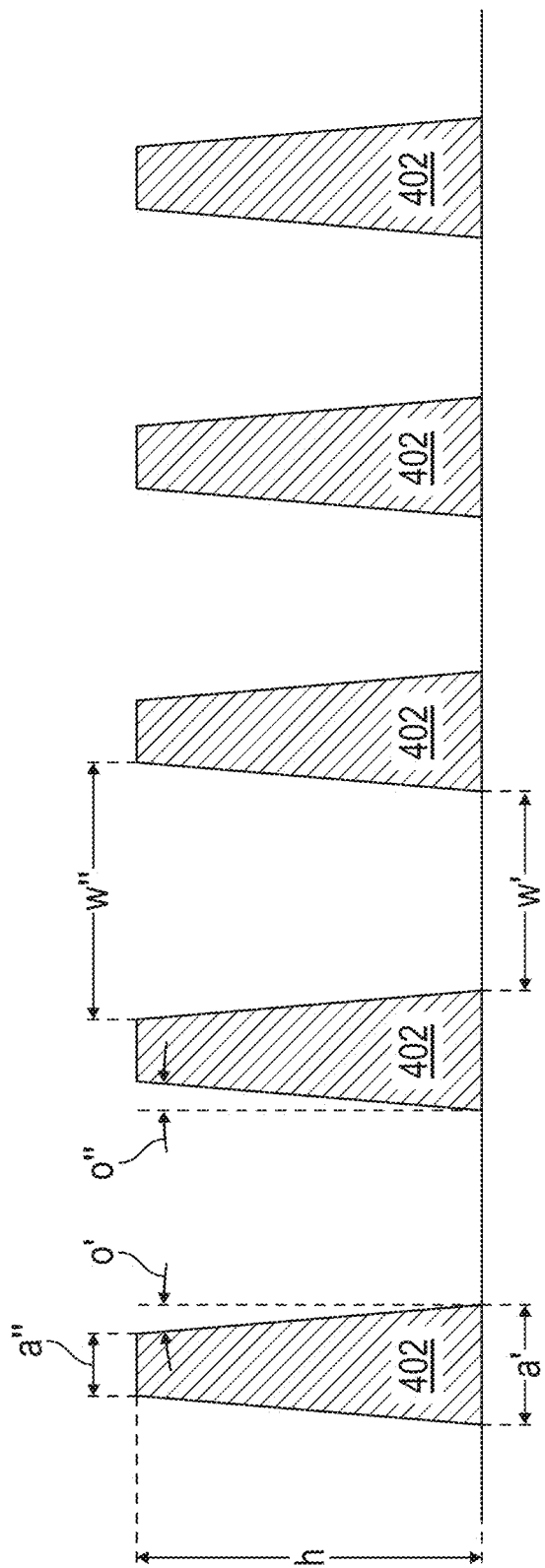
FIG. 4 is a diagram illustrating louvers of a solar panel constructed according to one or more embodiments.

FIG. 4 is a diagram illustrating louvers 402 of a solar panel constructed according to one or more aspects of the present invention. As shown the louvers 402 are dispersed across the top encapsulant layer 308. The size, shape, height, and separation of the louvers is designed to cause the solar panel to have a desired appearance from one or more particular side viewing angles and also to maximize the amount of solar energy that passes through the top encapsulant layer 308, which includes the louvers, to the photovoltaic cells 306.

Figure 5A:
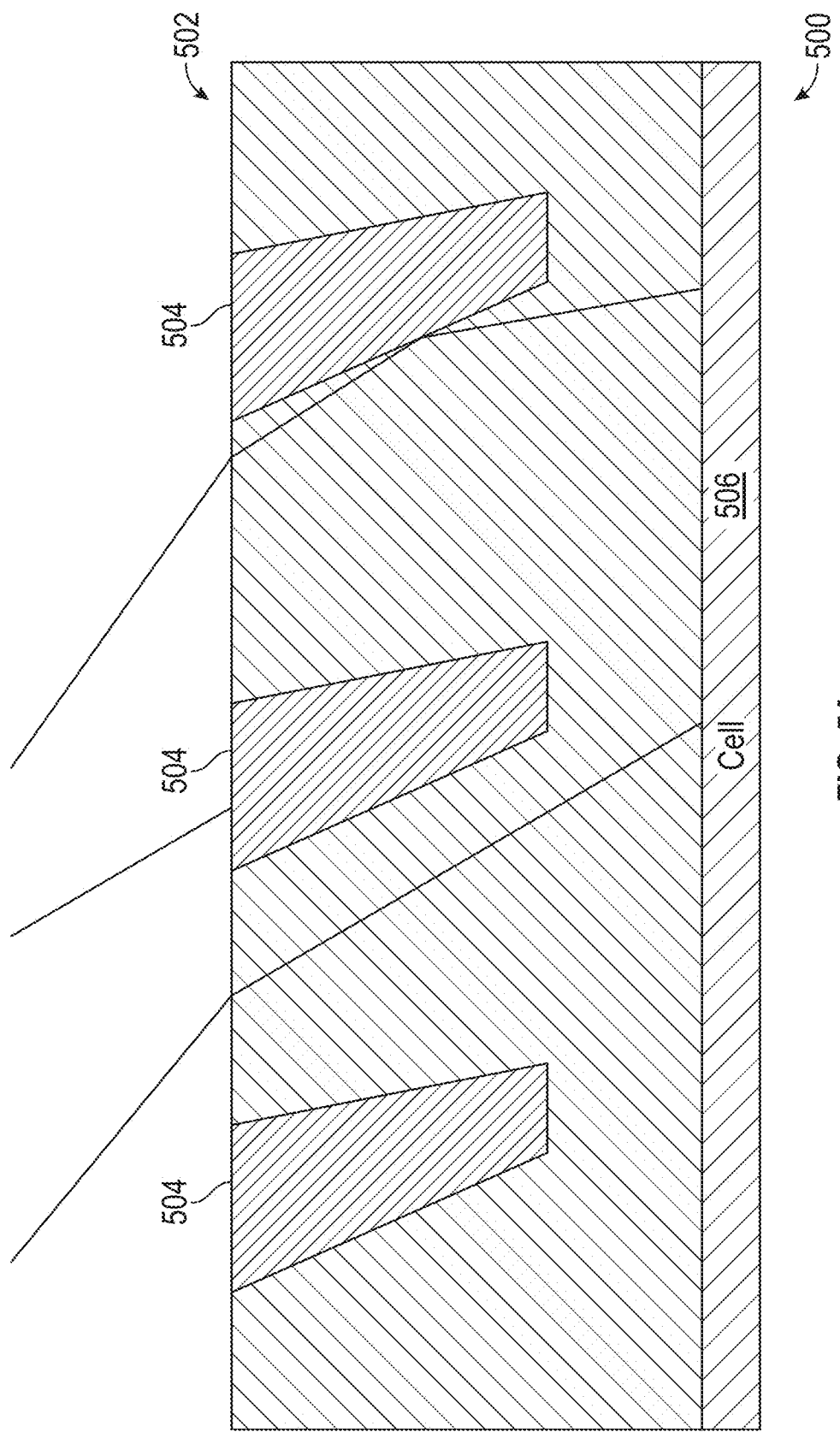
FIG. 5A is a diagram illustrating the path of solar insolation upon a solar panel via a louver layer according to one or more embodiments.

FIG. 5A is a diagram illustrating the path of solar insolation upon a solar panel 500 via a louver layer 502 according to one or more aspects of the present disclosure. As is shown, the louvers 504 are preferably designed and constructed to pass a maximum amount of solar energy to the photovoltaic cells 506 and to cause the solar panel to have a desired appearance from a side viewing angle. The design of the louvers 504 is made to maximize performance and to meet aesthetics. Simulations may include simple ray tracing and take into account refractive index of the surface of the cell, impact of multiple reflections, and the exact position of the sun. Approximations in the design may consider un-polarized light, full absorption by the photovoltaic cells inside the louvers, that the simulated day is sunny and that the layers are transparent. The louvers 504 shown in FIG. 5A may be tilted to assist in internal collection of solar energy to increase efficiency of the solar panel 500. The louver layer 502 may be a film that contains the louvers 504.

Figure 5B:
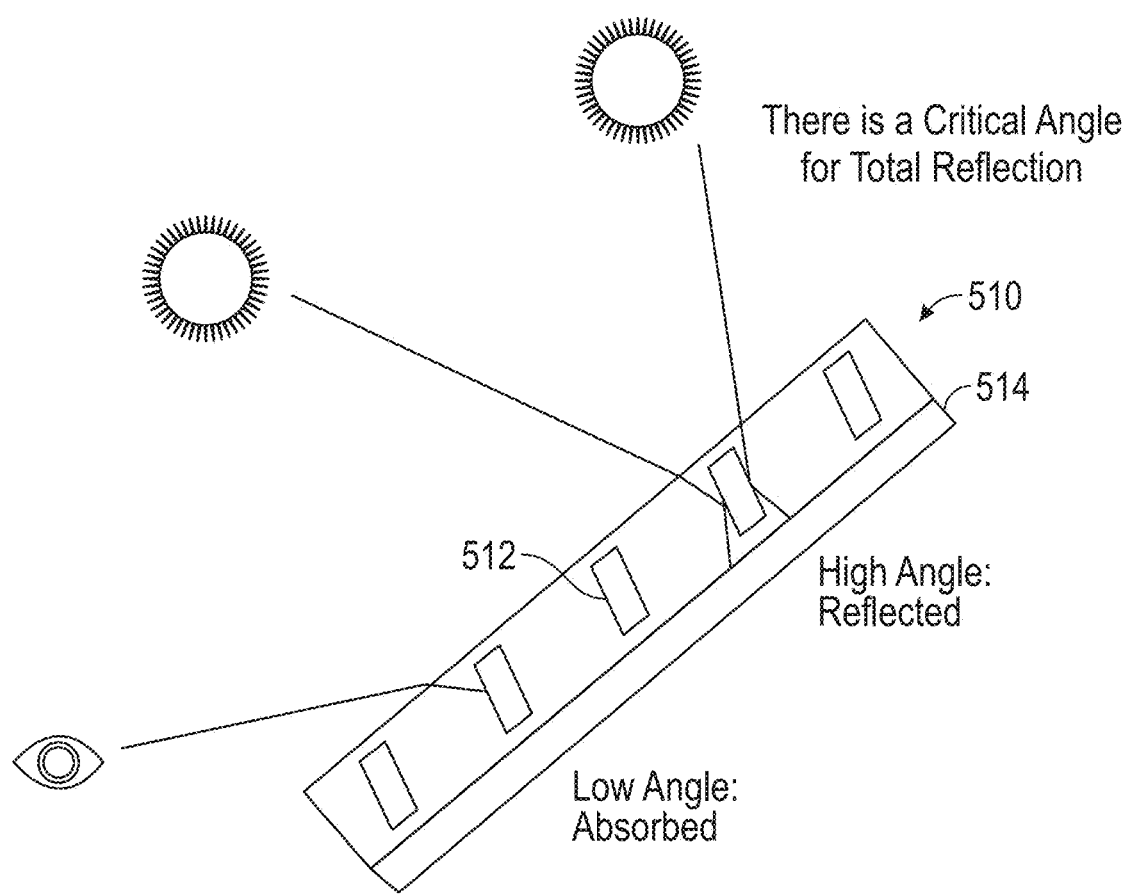
FIG. 5B is a diagram illustrating a solar panel that includes tilted louvers constructed according to one or more embodiments.

FIG. 5B is a diagram illustrating a solar panel 510 that includes tilted louvers 512 constructed according to one or more aspects of the present disclosure. With tilted louvers 512, such as those illustrated in FIG. 5A, sunlight at a low angle with respect to the solar panel is absorbed to obscure the view of the photovoltaic cells from an angle of an observer, and the sunlight that is received at a high angle of incidence is reflected (internally in some embodiments) by the louvers 512 onto the photovoltaic cells 514.

Figure 6A:
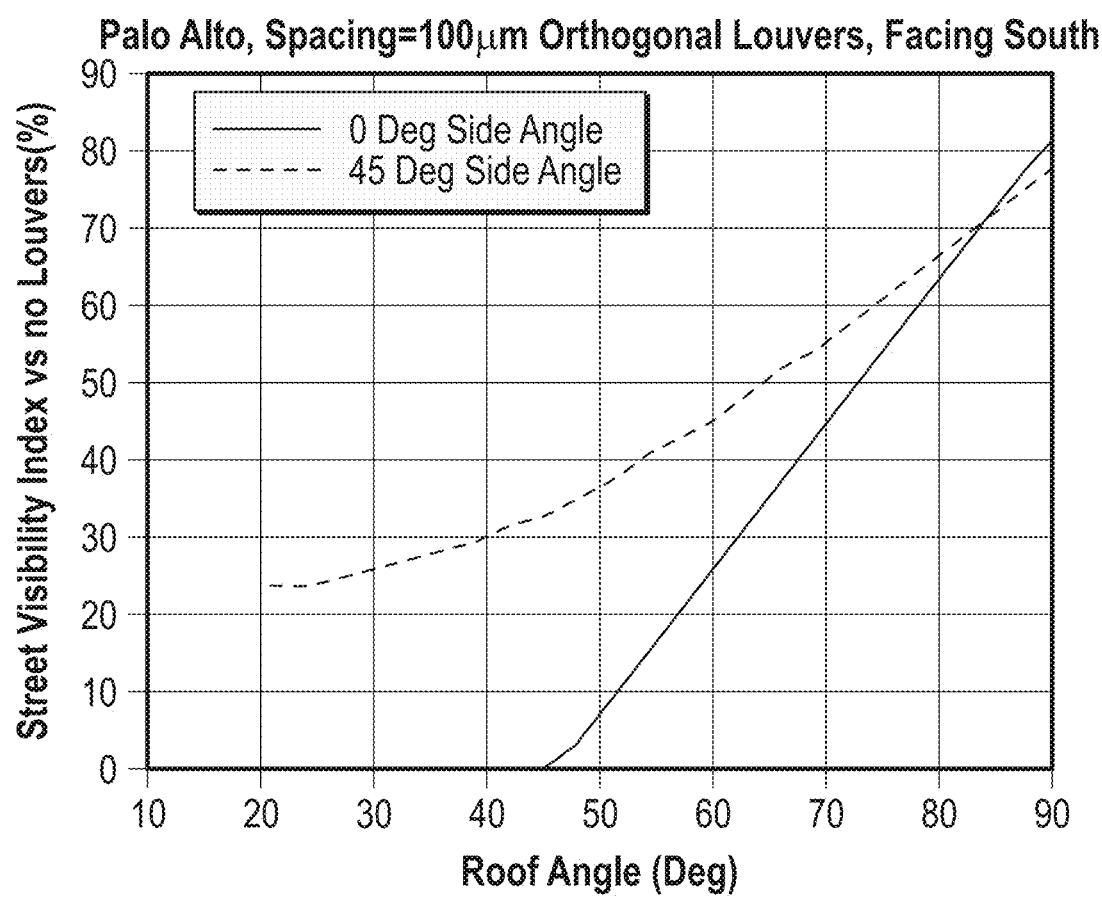
FIG. 6A is a graph illustrating street visibility index versus roof angle of a solar panel constructed according to one or more embodiments.

FIG. 6A is a graph illustrating street visibility index versus roof angle of a solar panel constructed according to one or more aspects of the present disclosure. As is shown, as the roof angle approaches 90 degrees, more of the photovoltaic panel is visible (louvers hide less). Further at low roof angles, the photovoltaic panels are not viewable from a zero-degree side view but lesser impeded from a 45-degree side view. Parameters modeled to create these simulated results include the shape and orientation of the louvers (e.g., orthogonal louvers with 100 micron spacing), the roof orientation (e.g., facing south), the geographic location of the roof (e.g., Palo Alto, Calif.), the day, the hour, and other parameters, as well as the refractive index of the matrix and the louvers.

Figure 6B:
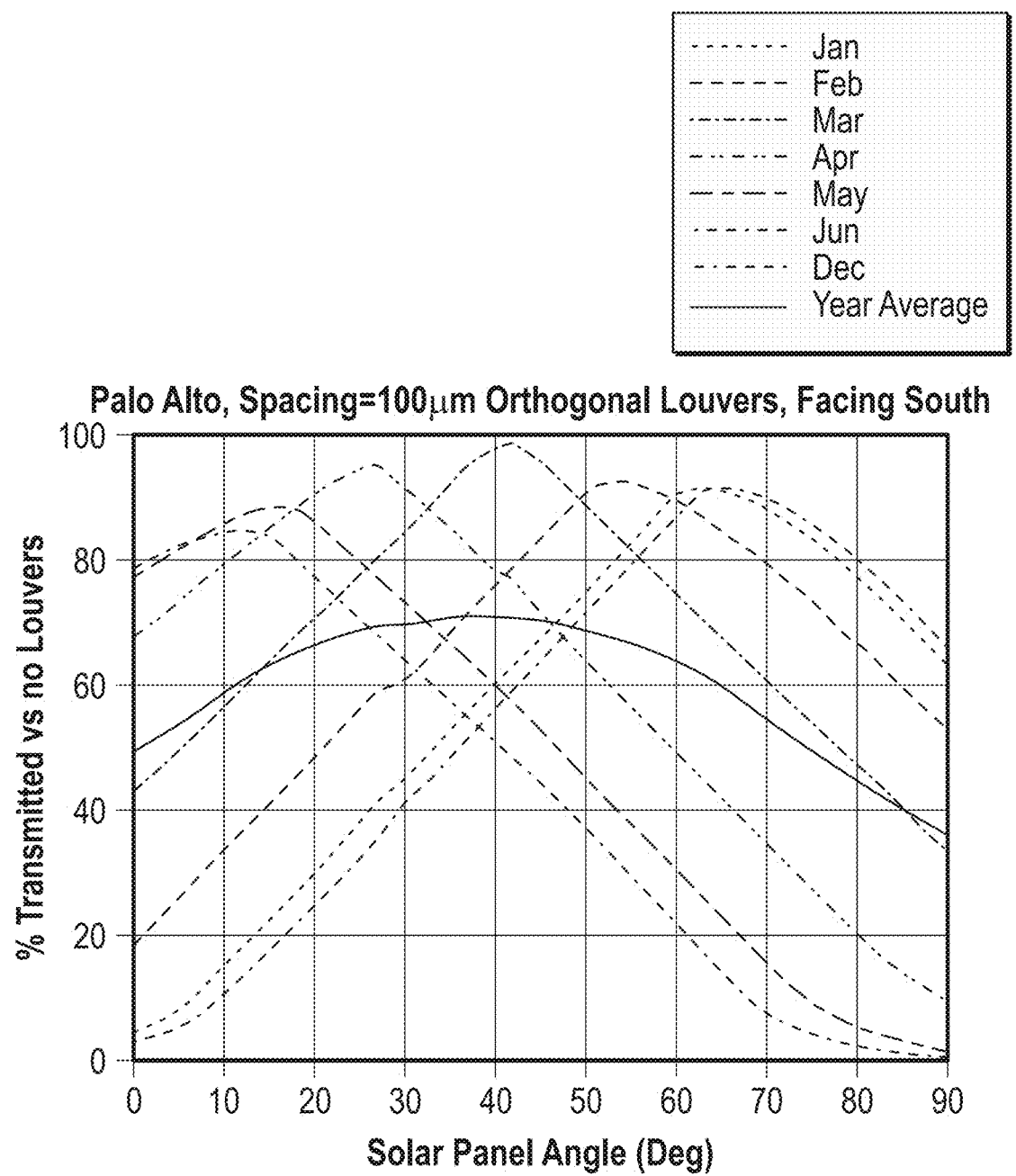
FIG. 6B is a graph illustrating the percentage of sunlight transmitted through the louvers versus solar panel angle of a solar panel constructed according to one or more embodiments.
Figure 7A:
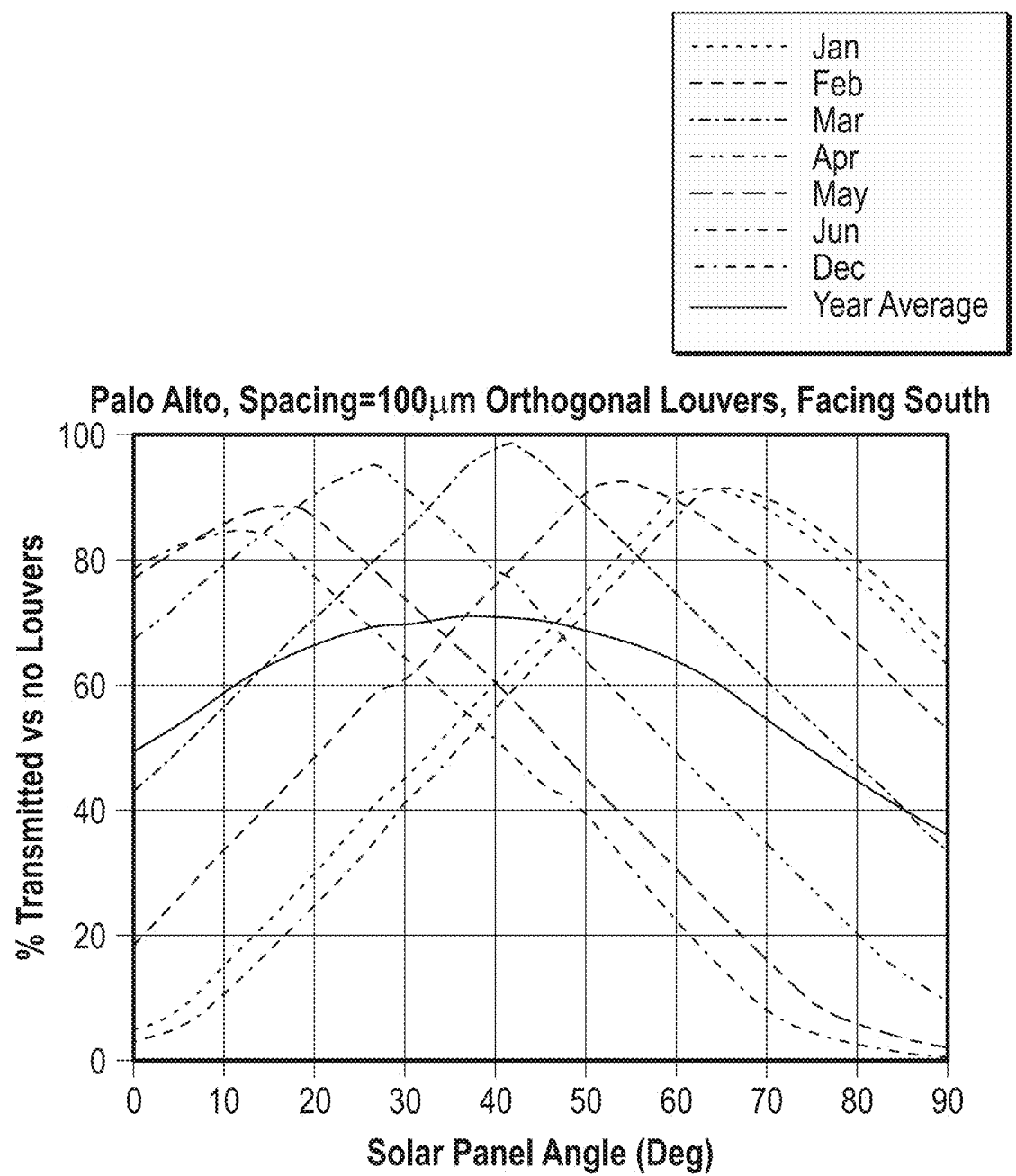
FIGS. 7A, 7B, 7C, and 7D are graphs illustrating the percentage of sunlight transmitted through the louvers versus solar panel angle of a solar panel constructed according to one or more embodiments.
Figure 7B:
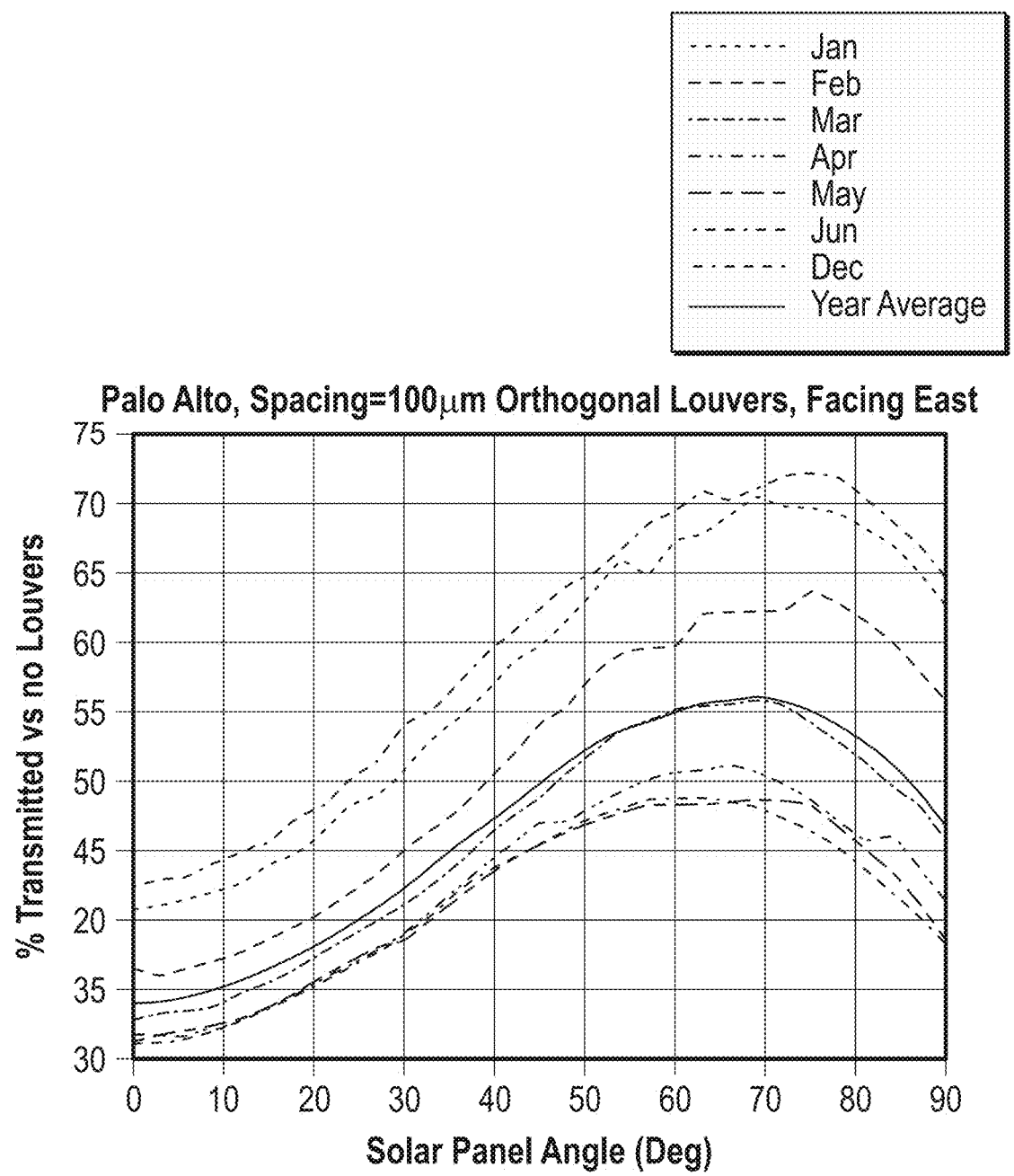
Figure 7C:
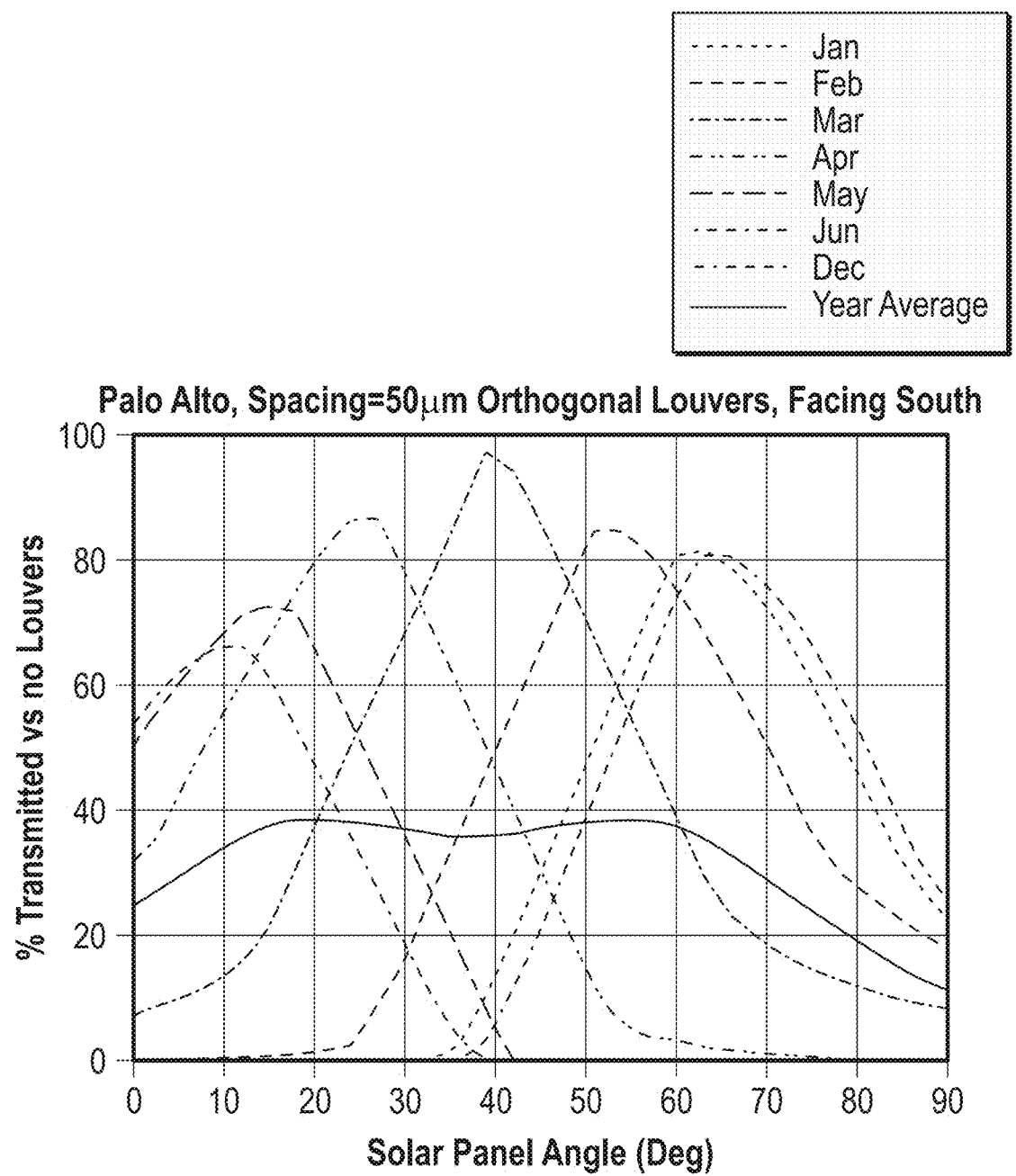
Figure 7D:
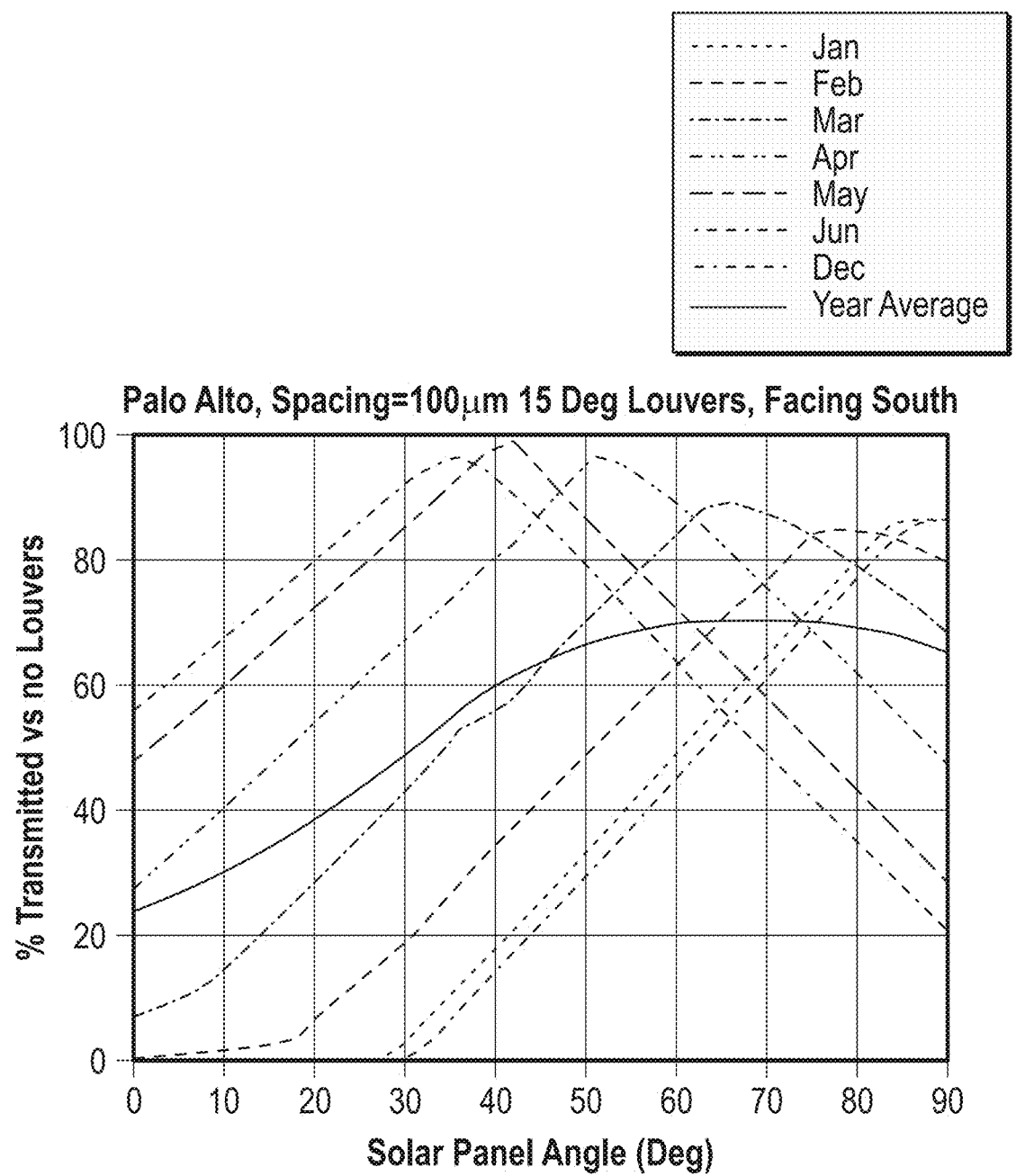

FIG. 6B is a graph illustrating the percentage of light transmitted though the louvers versus solar panel angle of a solar panel constructed according to one or more aspects of the present disclosure. As is illustrated, these graphs consider month of the year and yearly average of the percent of transmitted light though the top encapsulant layer, which includes the louvers, versus solar panel angle for a particular louver design.

FIGS. 7A, 7B, 7C, and 7D are graphs illustrating the percentage of light transmitted through the louvers versus solar panel angle of a solar panel constructed according to one or more aspects of the present disclosure. As is illustrated, these graphs consider month of the year and yearly average of the percent of transmitted light though the top encapsulant layer, which includes the louvers, versus solar panel angle for particular louver designs.

Figure 8A:
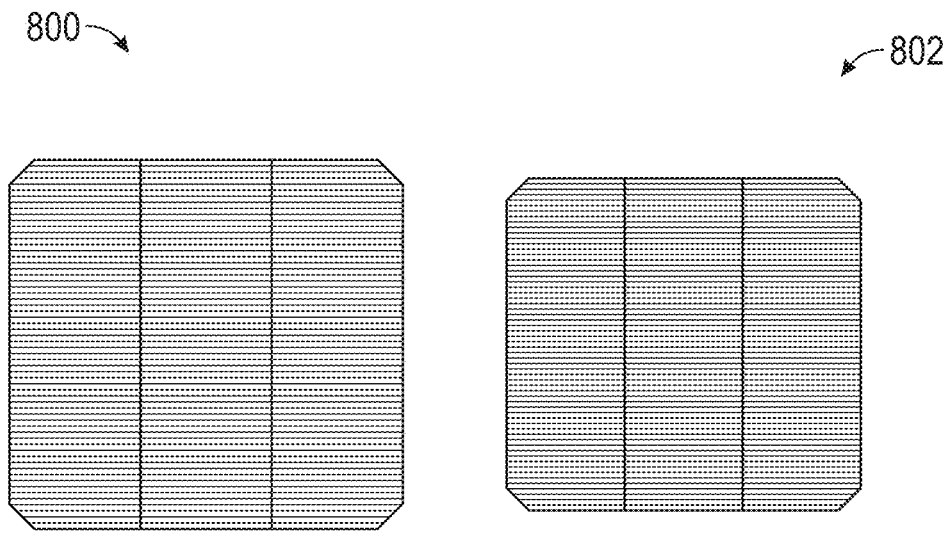
FIGS. 8A and 8B illustrate a prior art solar panel and a portion of a solar panel constructed according to one or more embodiments.
Figure 8B:
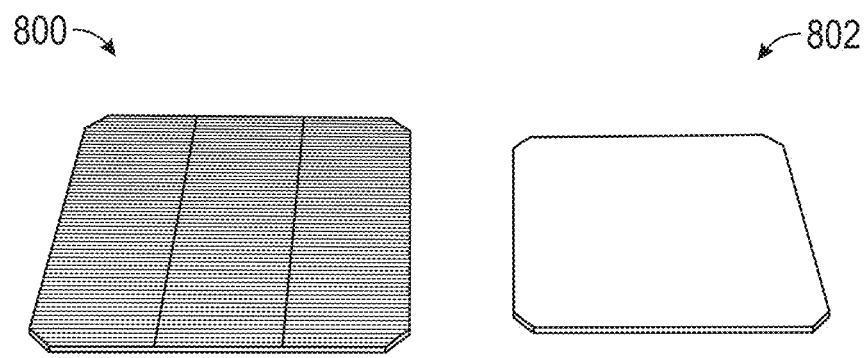

FIGS. 8A and 8B illustrate a prior art solar panel 800 and a portion of a solar panel 802 constructed according to one or more aspects of the present disclosure . The solar panel 802 causes the photovoltaic cells to be viewable from a close to perpendicular viewing angle in FIG. 8A and to be hidden from more of a side angle view in FIG. 8B. Contrast this to the prior art solar panel 800 that allows the photovoltaic cells to be seen from both viewing angles.

Figure 9A:
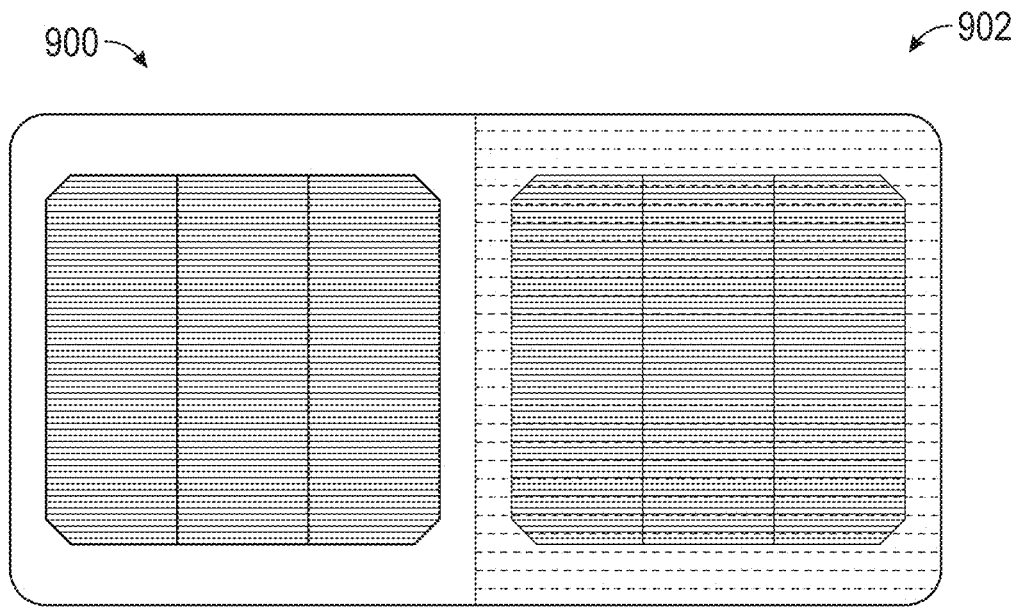
FIGS. 9A and 9B illustrate a prior art solar panel and a portion of a solar panel constructed according to one or more embodiments.
Figure 9B:
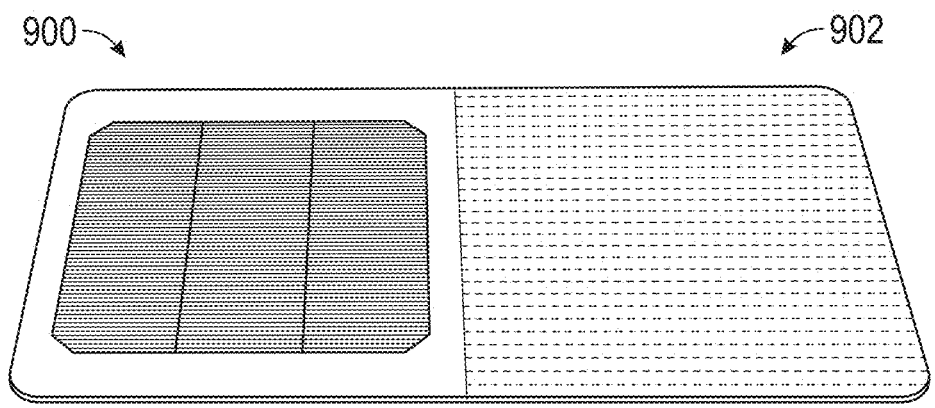

FIGS. 9A and 9B illustrate a prior art solar panel 900 and a solar panel 902 constructed according to one or more aspects of the present disclosure. The solar panel 902 causes the photovoltaic cells to be viewable from a close to perpendicular viewing angle in FIG. 9A and to be hidden from more of a side angle view in FIG. 9B. Contrast this to the prior art solar panel 900 that allows the photovoltaic cells to be seen from both viewing angles.

Figure 10A:
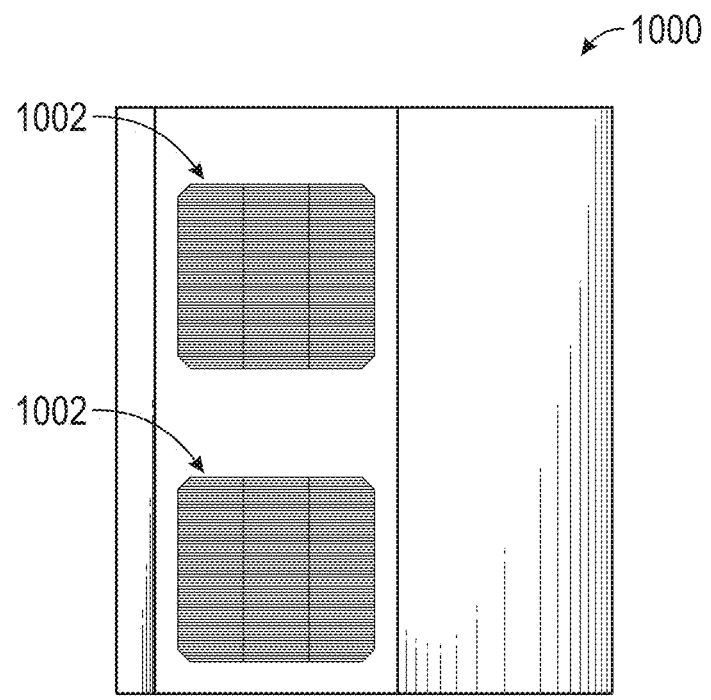
FIGS. 10A and 10B are photographs of a roofing tile that has mounted therein a solar panel constructed according to one or more embodiments.
Figure 10B:
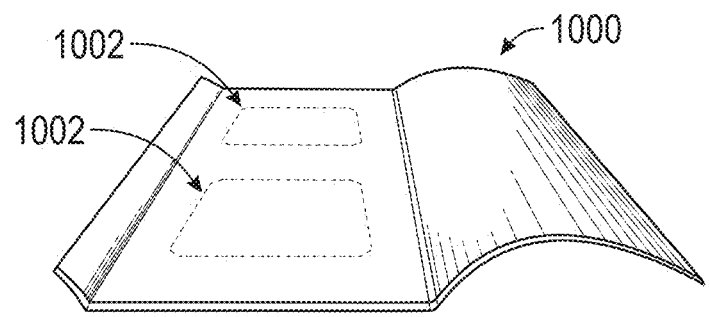

FIGS. 10A and 10B illustrate a roofing tile 1000 that has mounted therein a solar panel 1002 constructed according to one or more aspects of the present disclosure. When viewed from a substantially perpendicular viewing angle, the photovoltaic cells 1002 of the roofing tile 1000 are viewable in FIG. 10A. From a side angle as shown in FIG. 10B, the photovoltaic cells 1002 of the roofing tile 1000 are hidden or obscured.

Figure 11A:
FIGS. 11A and 11B include photographs and diagrams illustrating steps in designing solar panels for one or more dwellings according to one or more embodiments.
Figure 11A:
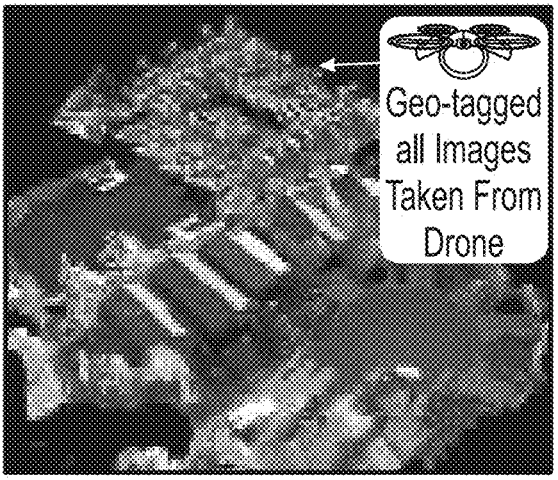
Figure 11A:
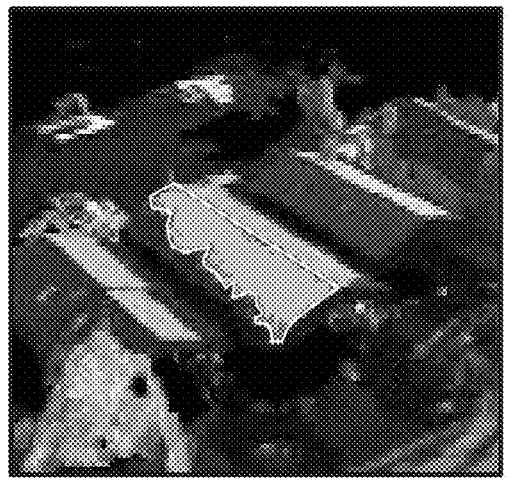
Figure 11A:
Figure 11A:
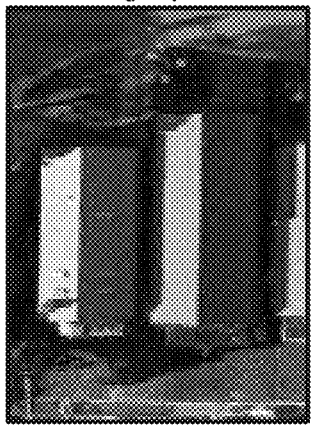
Figure 11A:
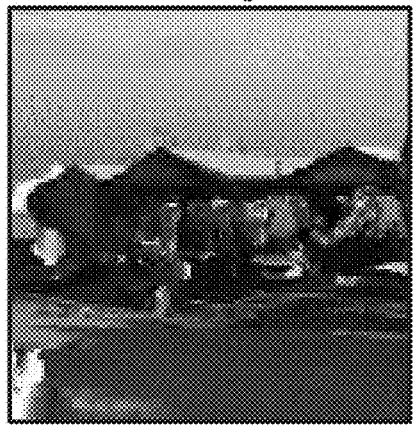
Figure 11B:
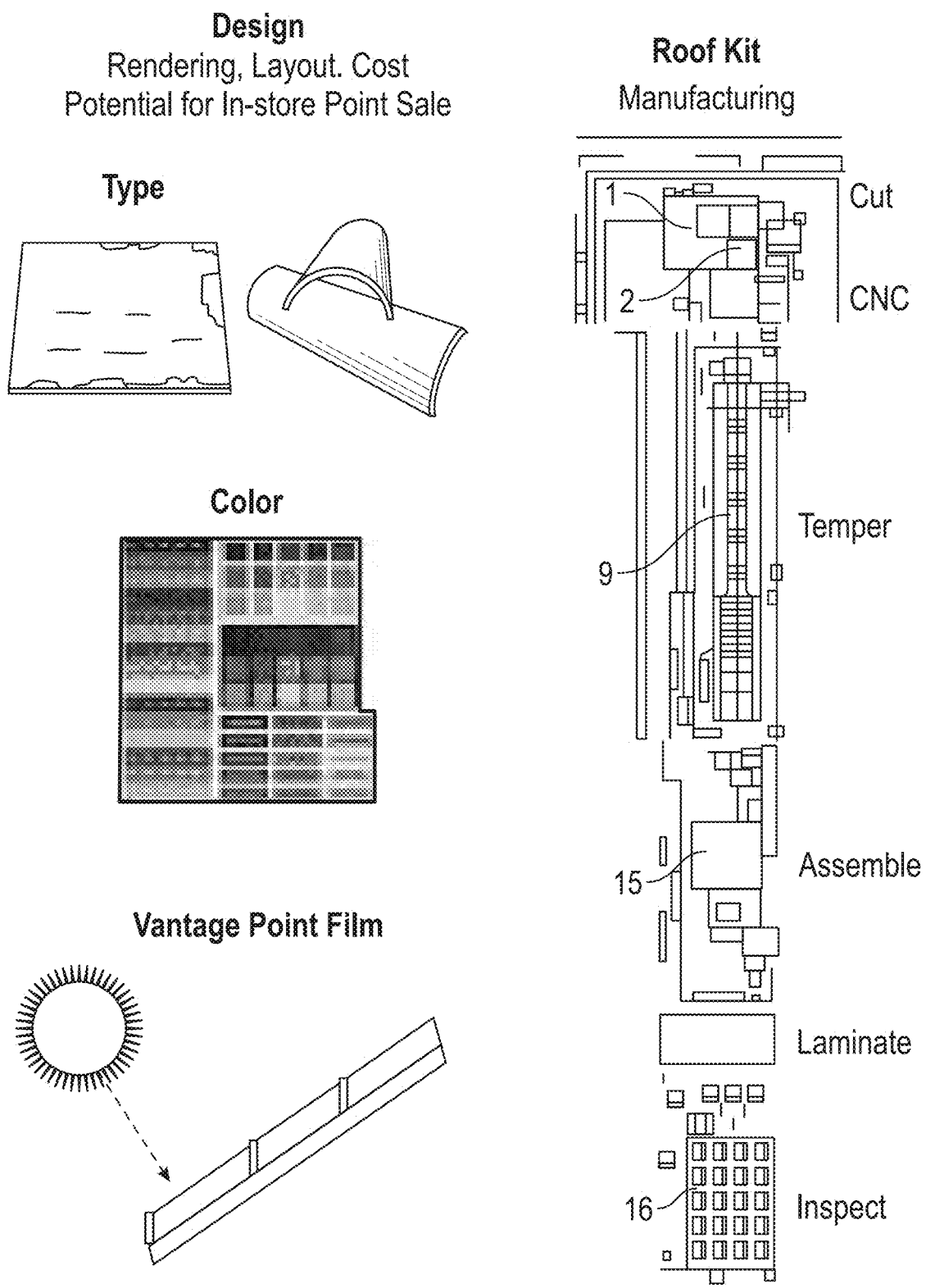

FIGS. 11A and 11B include photographs and diagrams illustrating steps in designing solar panels for one or more dwellings according to one or more aspects of the present disclosure. The first step is to make an assessment of a roof upon which solar panels will be installed. The dwelling, in this case, is photographed and then geotagged. Data is generated from the photograph and the geotag, e.g., area and features, roof pitch, geographical data, and a street vantage point. The solar panels are then designed, rendered, laid out and considered for cost based upon the generated data. The color of the roof, the type of solar panel to be installed, the vantage point film, and other considerations are made in the design of the solar panel. A roof kit is then generated, tempered, assembled, laminated, inspected, and shipped to the site for installation.

Figure 12:
FIG. 12 is an overhead view of a neighborhood having homes located therein for which solar panels of the homes are designed according to one or more embodiments.

FIG. 12 is an overhead view of a neighborhood having homes located therein for which solar panels of the homes are designed according to one or more aspects of the present disclosure. The neighborhood in which the homes are located may have restrictive covenants requiring certain roofing appearance. The solar panels may be designed to meet these restrictive covenants and local laws and further to cause the aesthetics of the installation to be attractive.

Figure 13:
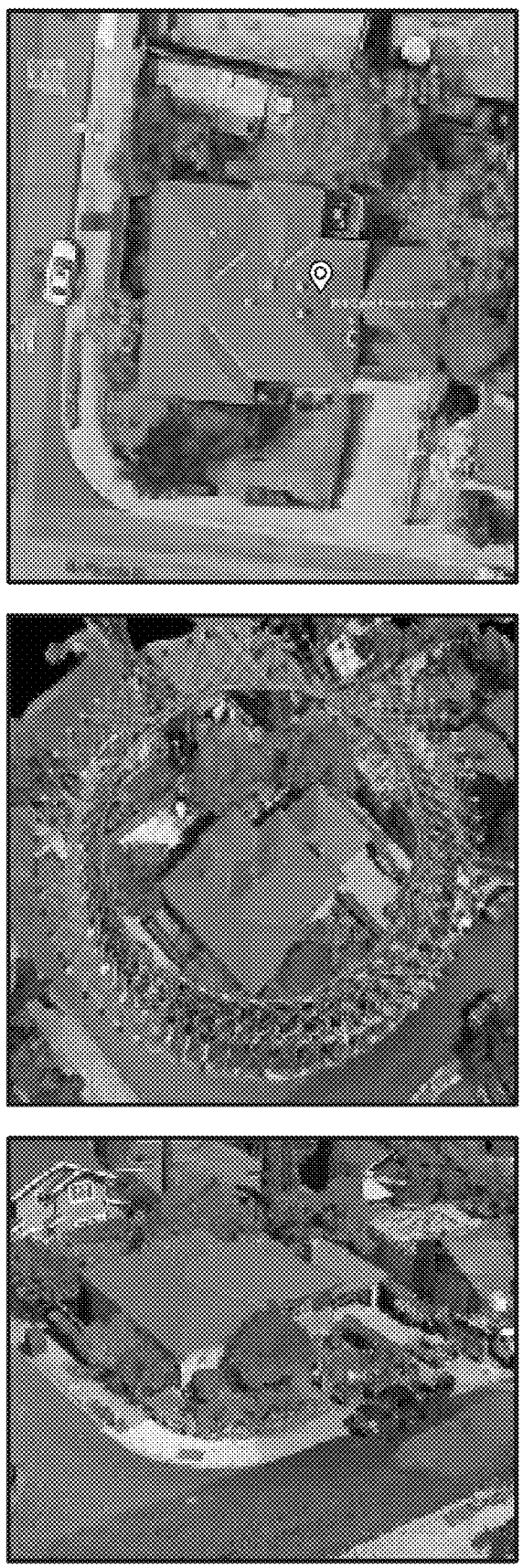
FIG. 13 are photographs illustrating views of a home having solar panels mounted thereon that are designed and constructed according to one or more embodiments.

FIG. 13 are photographs illustrating views of a home having solar panels mounted thereon that are designed and constructed according to one or more aspects of the present disclosure.

Figure 14:
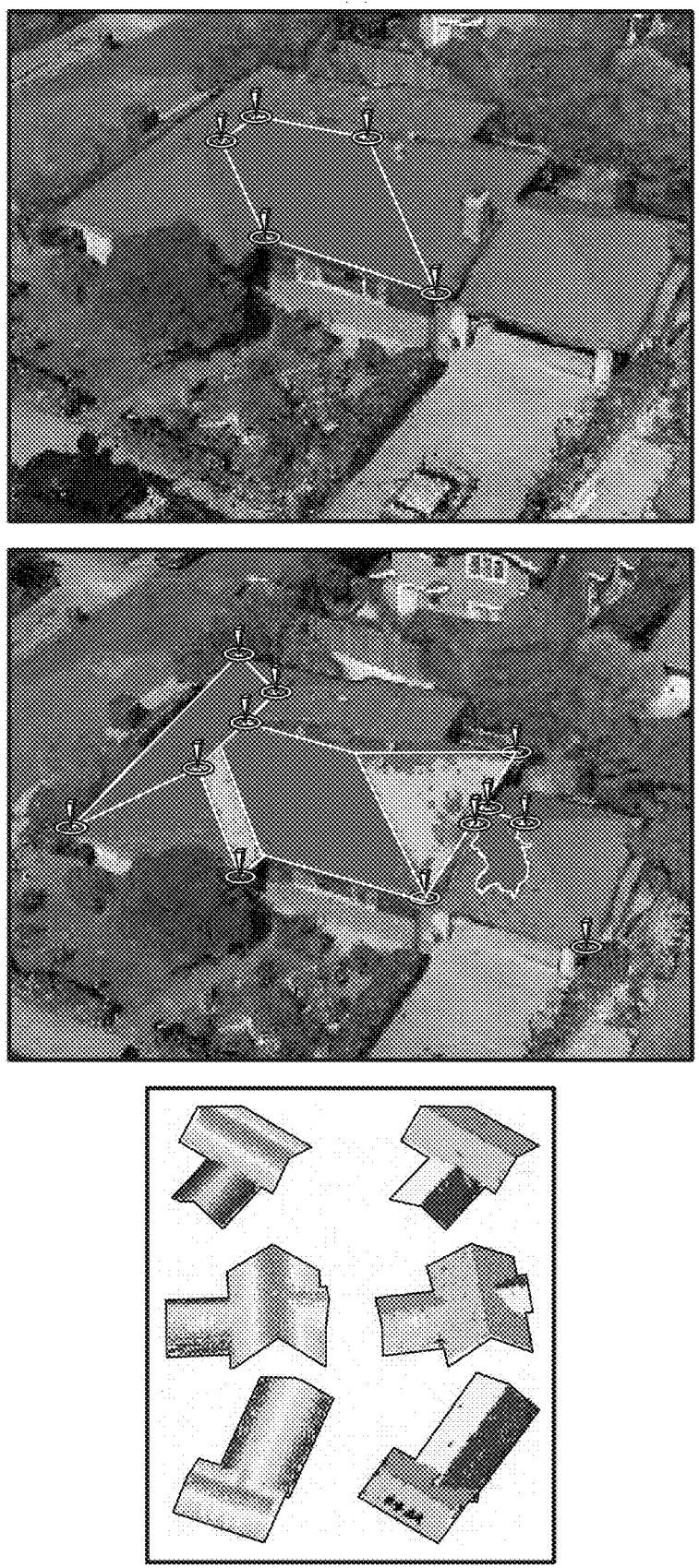
FIG. 14 are photographs illustrating views of a home having solar panels mounted thereon that are designed and constructed according to one or more embodiments.

FIG. 14 are photographs illustrating views of a home having solar panels mounted thereon that are designed and constructed according to one or more aspects of the present disclosure.

Figure 15A:
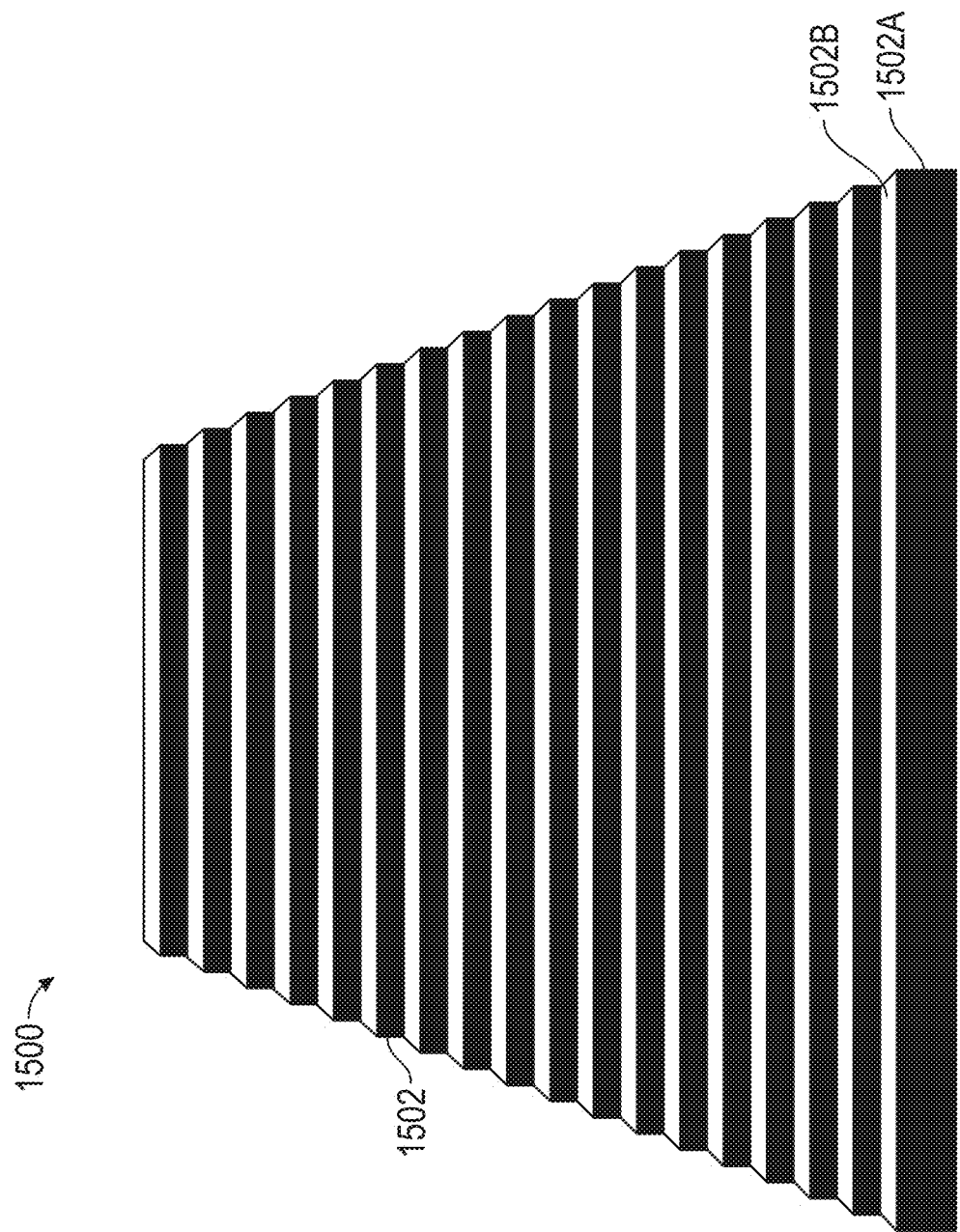
FIGS. 15A, 15B, 15C and 15D illustrate a top layer that is constructed of glass and that includes a saw tooth surface that obscures a view of covered photovoltaic cells from a low viewing angle.

FIGS. 15A, 15B, 15C, and 15D illustrate an embodiment of a top layer (e.g., top layer 310). Top layer 1500 illustrated in FIGS. 15A-15D is constructed of glass and includes a saw tooth surface 1502 that obscures a view of covered photovoltaic cells 1504 from a low viewing angle. Referring first to FIG. 15A, the top layer 1500 is shown to have a surface 1502 that is formed in a saw tooth pattern having vertical tooth surfaces 1502A and angled tooth surfaces 1502B. The vertical tooth surfaces 1502A are formed substantially perpendicular (approximately 90 degrees) to the solar panel structure and the angled tooth surfaces 1502B are formed at an angle that is between perpendicular to the solar panel structure and parallel to the solar panel structure. In some embodiments, this angle is selected based upon the installation location of the solar panel to cause the solar panel to be efficient while still able to hide the photovoltaic panels from a low angle side view. The view of FIG. 15A is a side view and the top layer 1500 is therefore substantially non-transparent based upon the black coloring upon the vertical tooth surfaces 1502A.

Figure 15B:
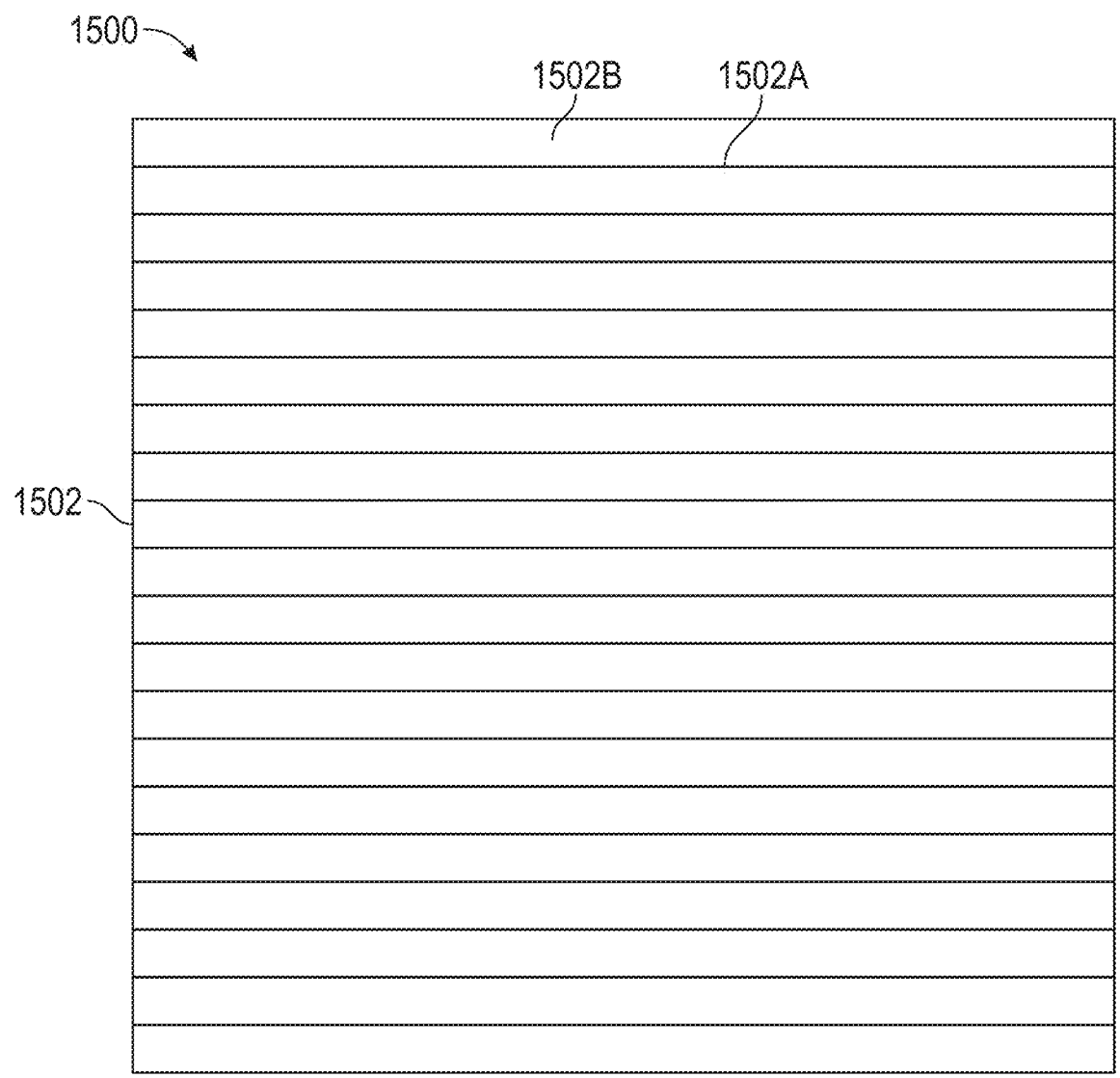

Referring next to FIG. 15B, the top layer 1500 is shown as being viewed from a perspective of approximately perpendicular to the solar panel. Thus, the top layer 1500 is mostly transparent from this perspective view.

Figure 15C:
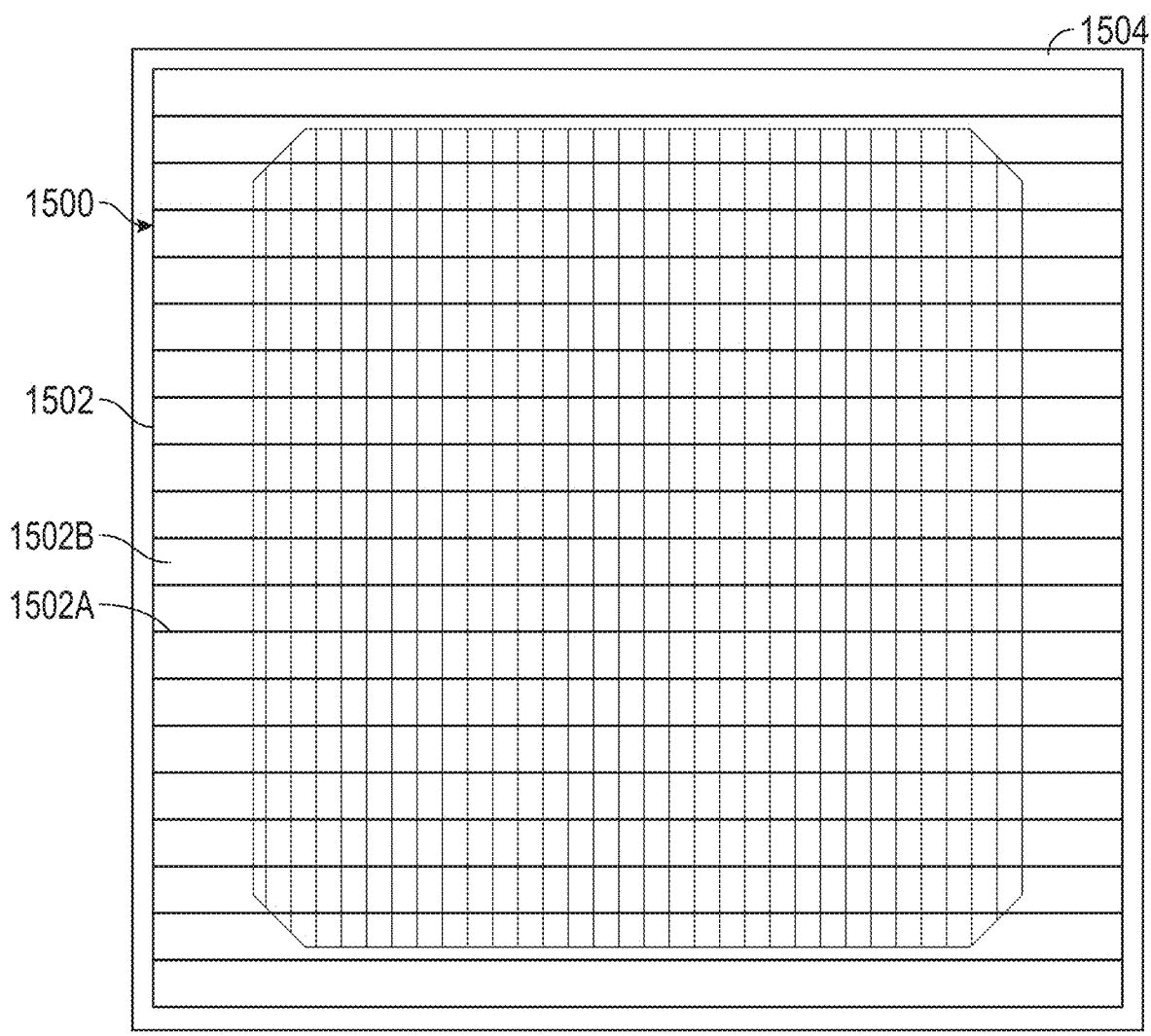

Referring next to FIG. 15C, the top layer 1500 is shown residing upon a photovoltaic cell layer 1504. The view of FIG. 15C is approximately from the same viewing angle as the view of FIG. 15B. From this viewing angle, the top layer is mostly transparent such that the photovoltaic cell 1504 may be viewed through the top layer 1500.

Figure 15D:
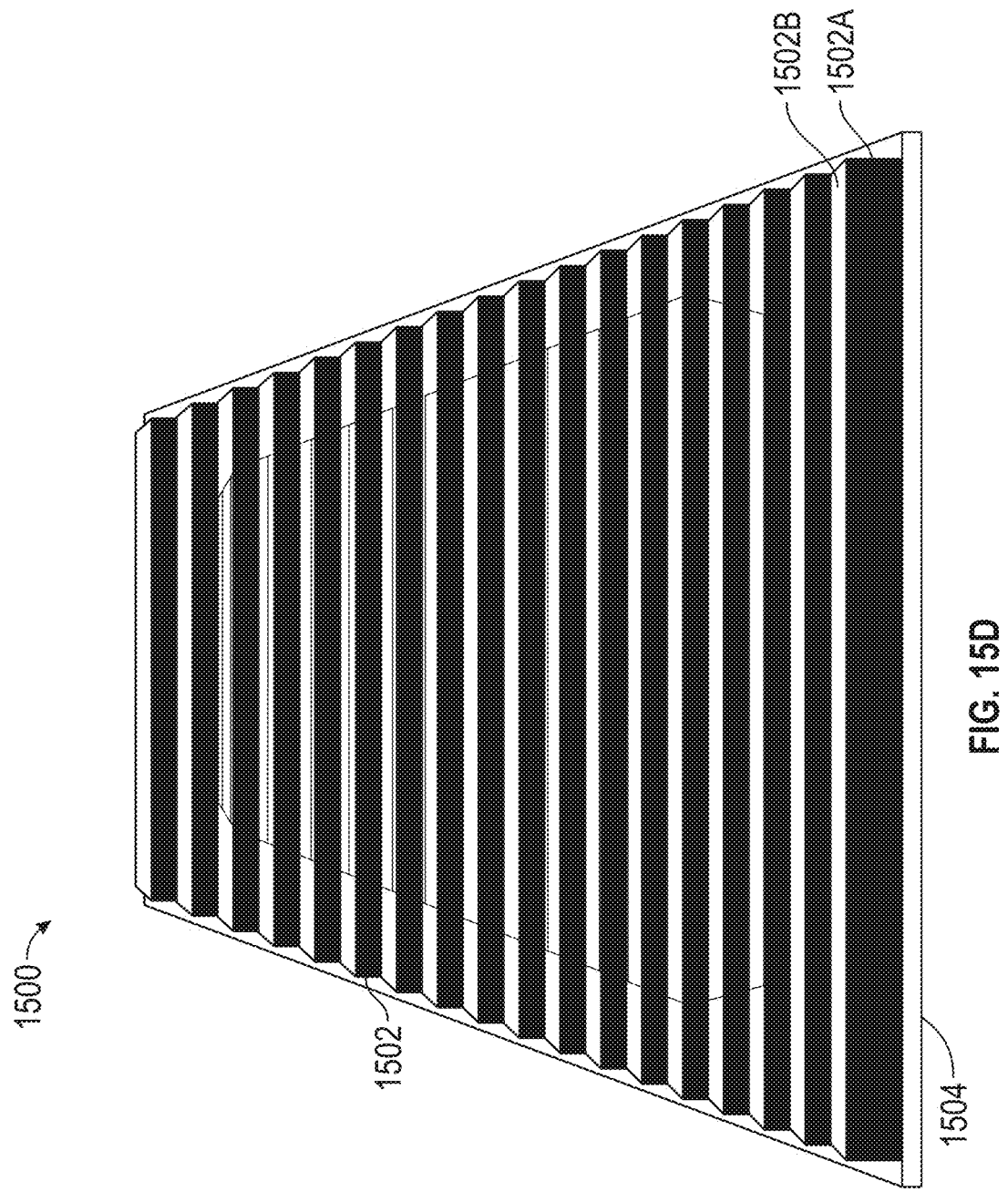

Referring next to FIG. 15D, the top layer 1500 is shown residing upon the photovoltaic cell layer 1504 from a view similar to that of FIG. 15A. Thus, the photovoltaic cells are hidden from view based upon the structure of the saw tooth surface of the top layer.

2. Coated Backsheet for Solar Panels

Figure 16:
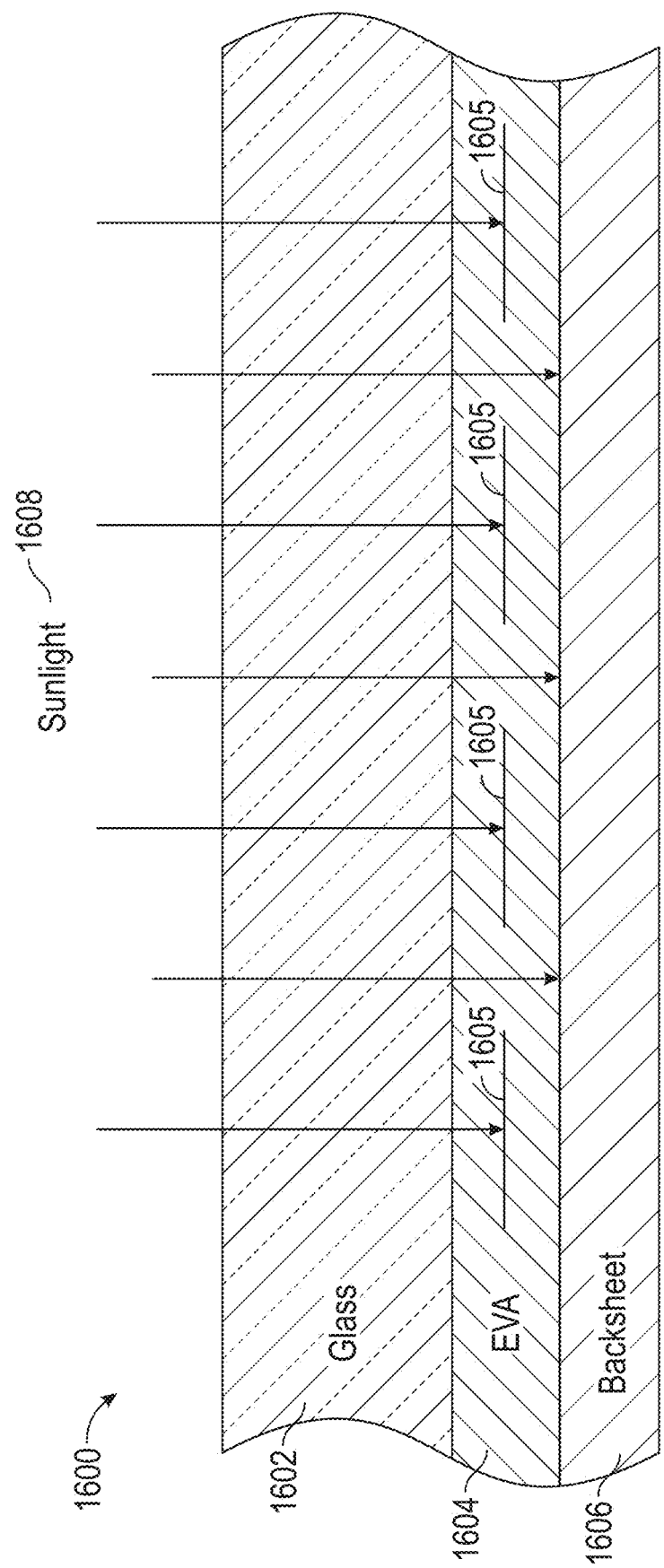
FIG. 16 is a sectional side view illustrating a laminated solar panel constructed according to one or more embodiments.
Figure 17:
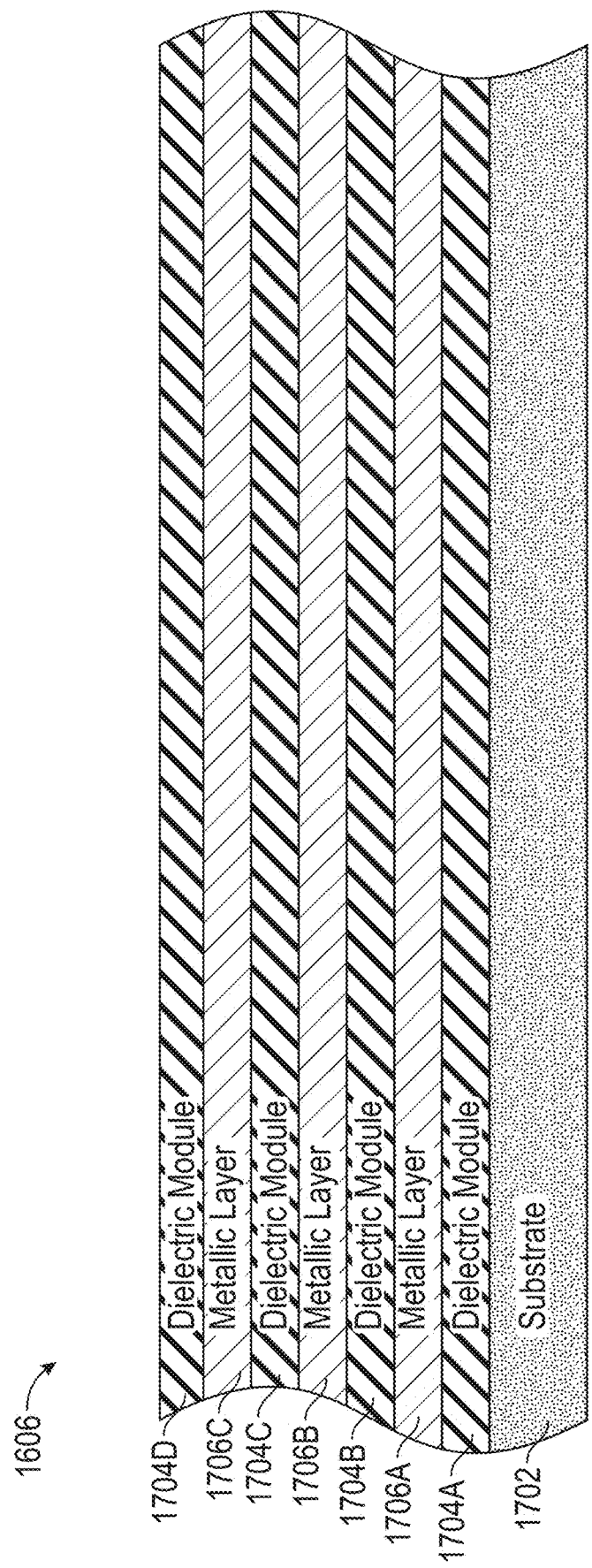
FIG. 17 is a sectional side view illustrating a coated backsheet constructed according to one or more embodiments.
Figure 18:
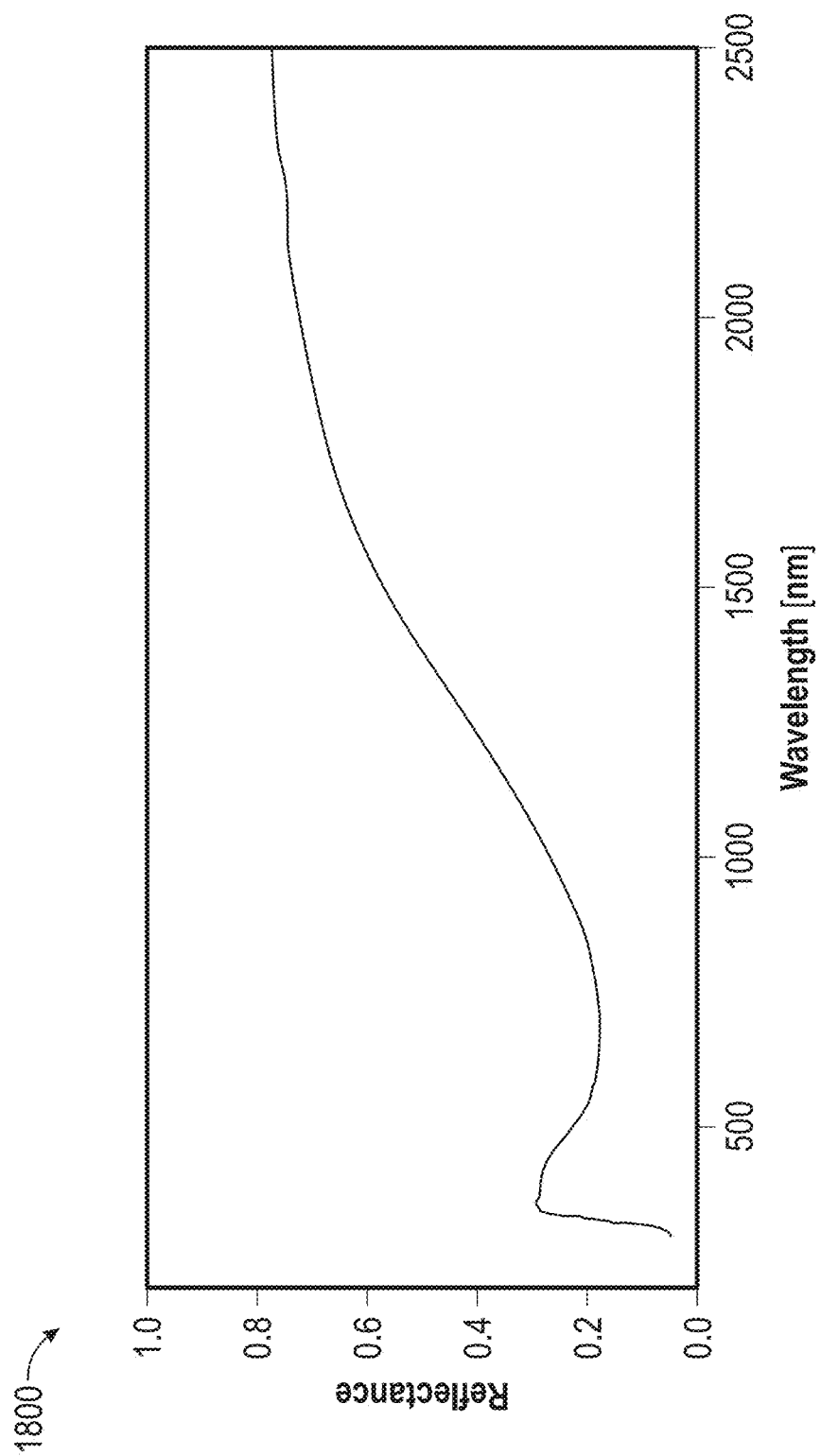
FIG. 18 is a graph illustrating the reflectance spectrum of a solar panel constructed according to one or more embodiments.

Turning now to FIGS. 16-18, a coated backsheet for a solar panel is described that reflects light in the infrared range to maintain a lower cell temperature of the solar panel while also providing low reflection in the visible range to color match the backsheet with the cell and improve the aesthetics of the solar panel.

In the architectural industry, physical vapor deposition (PVD) coatings made of alternate dielectric and metallic layers are successfully used to reduce the heat going into buildings. According to one or more embodiments, a new backsheet made of a coated plastic film that reflects light in the infrared range also provides low reflection in the visible range.

FIG. 16 is a sectional side view illustrating a laminated solar panel 1600 constructed according to one or more embodiments. The laminated solar panel 1600 includes a topsheet 1602, a solar cell layer 1604, and a backsheet 1606. The topsheet 1602 is made of glass in the illustrated embodiment but may be made of differing materials in other embodiments. The solar cell layer 1604 is made of EVA in the illustrated embodiment but may be made of differing materials, such as polyolefin, in other embodiments. The solar cell layer 1604 includes a plurality of solar cells 1605 encapsulated within the EVA material. Sunlight 1608 substantially passes through the topsheet 1602 and either impacts the solar cells 1605 or passes between the solar cells to the backsheet 1606. The backsheet 1606 absorbs some of the sunlight 1608 and reflects a portion of the sunlight.

FIG. 17 is a sectional side view illustrating a coated backsheet 1606 constructed according to one or more embodiments. According to certain embodiments, layers 1704A-1704D as shown in FIG. 17 are deposited using a PVD process on top of a substrate 1702. The backsheet panel 1606 is made of a transparent or non-transparent substrate 1702 such as glass, EVA, polyethylene terephalate (PET), or an alloy of polyphenylene oxide and styrene (modified PPO). The substrate 1702 may or may not contain absorbing material to cause it to have a black (or any other) color. On that substrate 1702 is applied a thin coating made of n+1 dielectric modules (1704A, 1704B, 1704C, and 1704D, also referred to as dielectric layers) and n metallic layers (1706A, 1706B, and 1706C), n being an integer (e.g., 1, 2, or 3). A coating of 2n+1 layers is applied as follows: dielectric module/metallic layer/dielectric module/metallic layer . . . /dielectric module/substrate, each metallic layer being between two dielectric modules and the substrate being in contact with a dielectric module. In some embodiments, the number of layers differs from the illustrated embodiments.

In some embodiments, a dielectric module is a transparent material made of one or several layers of nitrides or oxides of the elements Si, Al, Ti, Zn, Sn, Nb, In, Zr, or any combination of those elements. For example, 3 nm of $Si_3N_4$ material is a dielectric module, and a stack of 30 nm of $Si_3N_4$ and 10 nm of Zinc Aluminum oxide is also a dielectric module. A dielectric module thickness is preferably between 10 nm and 100 nm.

In some embodiments, a metallic layer is made of one or several layers of Ni, Cr, Fe, Nb, Ti, Cu, Al, Ag, Au, Pt, or any combination of those metals. For example, a layer of Nb is a metallic layer. A layer of Nb with Ni and Cr layers above or below the Nb layer is also a metallic layer. A metallic layer thickness is preferably between 4 nm and 40 nm.

According to certain embodiments of the present disclosure, the backsheet has different characteristics depending on the specific layers that are deposited using PVD. For example, a deposited layer of $Si_3N_4$ can provide an efficient barrier to alkaline ions such as Na+. Further, depositing a conductive layer as one of the layers in the backsheet coating can be used to enhance electrostatic properties. In some embodiments, one or more of the deposited layers that comprise the backsheet is electrically conductive and can be used as part of the energy harvesting mechanism. Specific structure or circuitry within that layer can be created by depositing the layer using PVD and subsequently laser etching away conductive material to create tracks (or circuity). According to some embodiments, the layers that are formed using PVD cause the backsheet to absorb light in the visual range, which aids in color matching of the backsheet to cell 1605. In some embodiments, the deposited layers are chosen to provide low overall radiation absorption (high reflection) while keeping low reflectance in the visible range, to yield desirable color matching to the cell while maintaining a lower cell temperature (e.g., providing less heat to the cell compared to some traditional backsheets) thereby increasing cell efficiency and energy generation.

FIG. 18 is a graph illustrating the reflectance spectrum of a solar panel constructed according to one or more embodiments. The embodiment resulting in the spectrum of FIG. 18 may be constructed as follows:

| Layer | Thickness |
|---|---|
| Si3N4 | 66.7 nm |
| Nb | 25.1 nm |
| Si3N4 | 14.2 nm |
| SiO2 | 38 nm |
| TiO2 | 18 nm |
| PET substrate | 0.5 mm |

In the reflectance spectrum of FIG. 18, the reflectance is higher for infrared wavelengths compared to wavelengths in the visible range, thus giving high performance of low visible reflectivity and high energy reflectivity. Total solar reflectance (ISO9050) is 28% (compared to 6% for a black sheet). The visible colors for D65 CIE 1934 at 60 degrees incidence is L*=55, a*=1, b*=−6 (giving a purple color matching the cell). For comparison a white backsheet would have L*>70, not matching the cell.

In some embodiments, a coating is obtained by PVD with commercially available equipment, for example in a roll-to-roll process. For example: $Si_3N_4$ can be obtained by reactive sputtering of a Si target in a plasma made of argon and nitrogen; TiO2 can be obtained by sputtering of a $TiO_x$ target in argon; $SiO_2$ can be obtained by sputtering of a Si target in $O_2$, Ar plasma; and Nb layer can be obtained by sputtering of a Nb target in Ar plasma.

This PVD coating technology is well known for architectural coatings. Optional functionalities to the backsheet include electricity conduction for energy harvesting. This can be obtained by laser etching of tracks inside the film, which is already conductive. The $Si_3N_4$ layer used in some exemplary coatings is an efficient barrier to alkaline ions such as Na+. In some embodiments, the conductive nature of the film has good electrostatic properties.

3. Solar Cell Camouflage Structures

Turning now to FIGS. 19-24, techniques are described to obscure solar panels from view through specialized construction of patterned camouflage films, textured backsheets, and colored backsheets.

Figure 19:
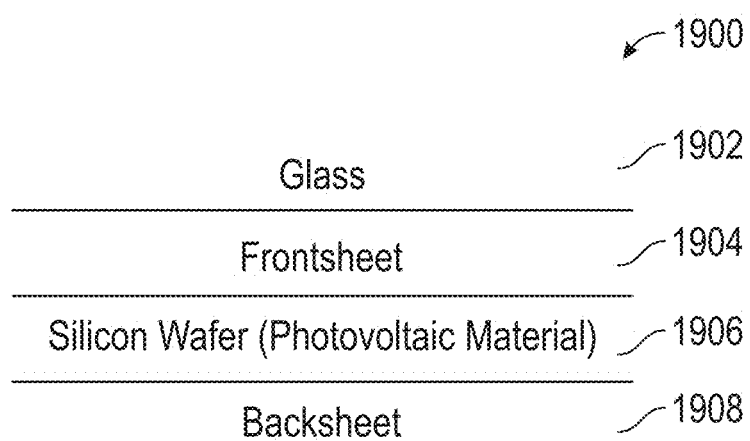
FIG. 19 is a sectional side view illustrating a laminated solar panel constructed according to one or more embodiments.

FIG. 19 shows a sectional side view that illustrates a solar cell 1900. The solar cell 1900 shown in FIG. 19 comprises a silicon wafer 1906 that acts as the photovoltaic material. On top of the silicon wafer 1906 is typically a polymer front sheet 1904 and on top of the polymer front sheet 1904 a glass layer 1902 (e.g., a topsheet). The glass layer 1902 may comprise amorphous silica. The glass layer 1902 may also comprise other transparent materials. In some embodiments, the solar cell 1900 is obscured in such a manner that an observer finds it difficult to see the solar cell 1900 and the solar cell 1900 blends into the background, or looks similar to the surrounding environment. FIG. 21B illustrates a solar cell 2108 that does not blend into the surrounding roofing tile 2110 (together referred to as a solar tile 2106). The solar cell 2108 is observable towards the center of each roofing tile 2110. Solar cells may use other photovoltaic material beside a silicon wafer and would still benefit from the obscuring and camouflage techniques described herein.

This disclosure describes ways to obscure or camouflage the solar cells from view by making them blend into the surrounding environment and/or obscure the silicon wafer from view. According to some embodiments, a system uses patterned coatings that camouflage the solar cell.

A. Patterned Coating To Camouflage The Solar Cell

The solar cells may be camouflaged from view by causing them to blend into the remainder of the solar tile using a camouflage pattern. This camouflage pattern includes a thin transparent coating that is patterned. The pattern includes blocks of a specific shape (such as a square, a rectangle, a circle, or an arbitrary shape). For example, the camouflage shape may comprise squares that are darker than the lightest color observed when observing the solar cell. This pattern of squares (or other geometries) may be randomly distributed around the area of the solar cell. In some embodiments, the coating allows light transmission for the solar spectrum greater than 50%, but is slightly reflective (reflection for the solar spectrum between 1 and 20%). That is, the coating reflects a portion of the solar spectrum that the photovoltaic material may absorb.

Figure 20A:
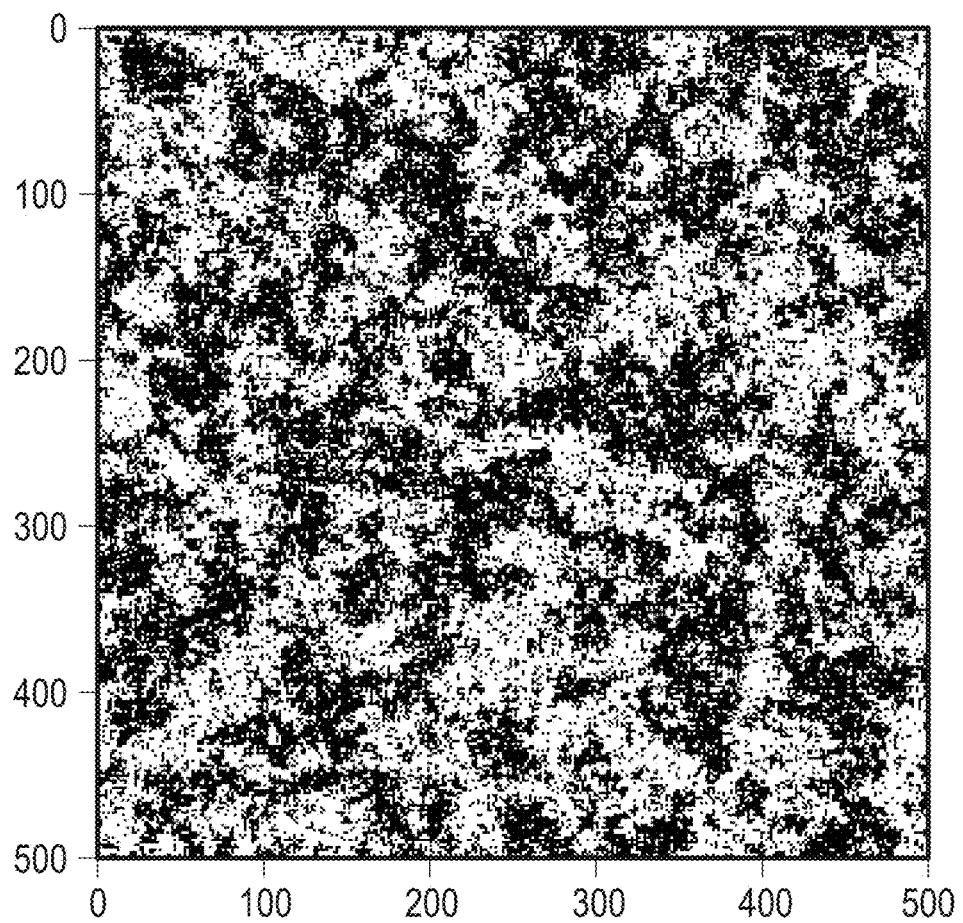
FIGS. 20A-20B are random patterns generated that can be used to create a camouflage film according to one or more embodiments.
Figure 20B:
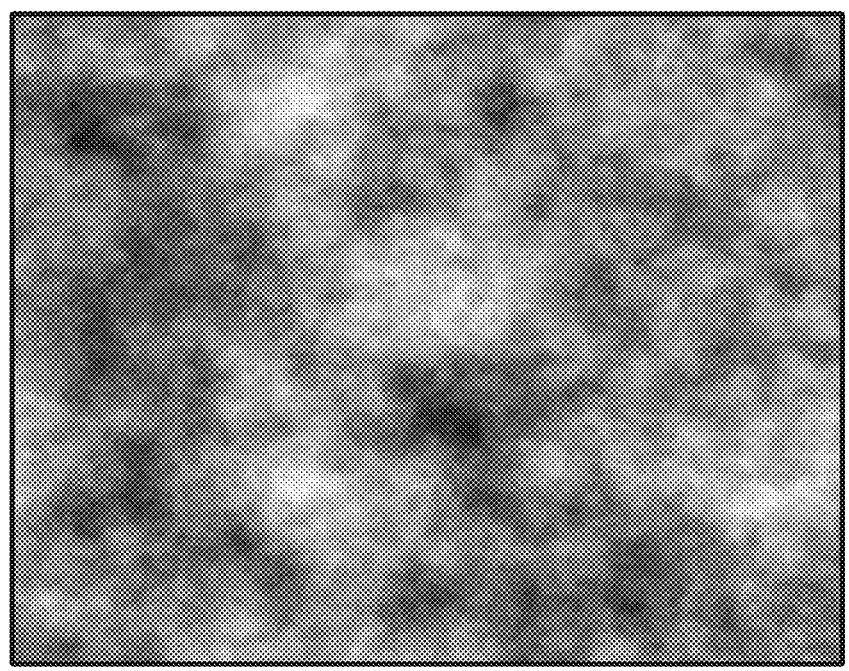

The random pattern of shapes (squares or other shape) may be generated using an Ising model utilizing the Metropolis algorithm. Specifically, Metropolis dynamics may be applied around the critical temperature to generate images having good scale invariance properties that are suitable for obscuring and camouflaging the solar cells. However, other methods such as random spatial processes, Gaussian random fields (e.g., a field generated using a Hurst spectral distribution law), or use of natural patterns such as stone pictures may be used to obtain both small scale and large scale features to make obscure the solar cell. FIG. 20A shows an output obtained using an Ising model utilizing the Metropolis algorithm. FIG. 20B shows an embodiment of a Gaussian field. These random patterns have the advantage that they look natural and non-repetitive. Optionally, colors of tiles and patterns can be varied from tile to tile to give a more natural appearance.

This random pattern may be used to generate a coating with a similar pattern. Depending on the specific parameters, for example, the size and shape of the object, different patterns may result.

The coating itself comprises one or more layers of material applied in some area, preferentially between 10% and 90% of the total area of the solar cell, to a transparent substrate, such as glass or a polymer sheet such as PET. The layers may be deposited to the transparent substrate, using PVD or another technique known to persons of skill in the art. The PVD or other technique must be able to form the required coating thickness and be compatible with the materials in the coating. For example, Ti, Zn, Si, Al, Sn, In, Cu, Zr, Nb, or Sb oxides or nitrides may be used as one or more of the layers formed on the substrate. Other layers may consist of metals such as Nb, Ag, Cu, Fe, Cr, Ni, Al, or Ti alone or in combination. An exemplary coating comprises 50 nm of $Si_3N_4$ applied on glass or PET by reactive sputtering of a Si target in a plasma containing Ar and $N_2$, such as widely used in PVD. Preferential deposition may be obtained using a mask (or other techniques known in the art). For example, the mask may be a sheet of Kapton® containing the specific pattern that is to be deposited. Other techniques that may be used to create the deposited pattern include photolithography or printing techniques. For example, an organic (e.g., organic polymer) with a negative pattern may be printed at the surface of glass. The polymer may act as a mask for a layer coated using PVD (or another technique). The organic may then be removed, by for example, burning the material in an oven to remove it. In some embodiments, the coating is achieved by sublimation printing or other ink printing technique.

The coating may be in the form of a film applied to the glass layer 1902 (either the front or the back) of FIG. 19 or the frontsheet layer 1904 (either the front or the back) of FIG. 19. The coating may also be directly printed onto either the glass or frontsheet. Alternatively, the coating may comprising a separate layer that is above the silicon wafer shown in FIG. 19.

Figure 21A:
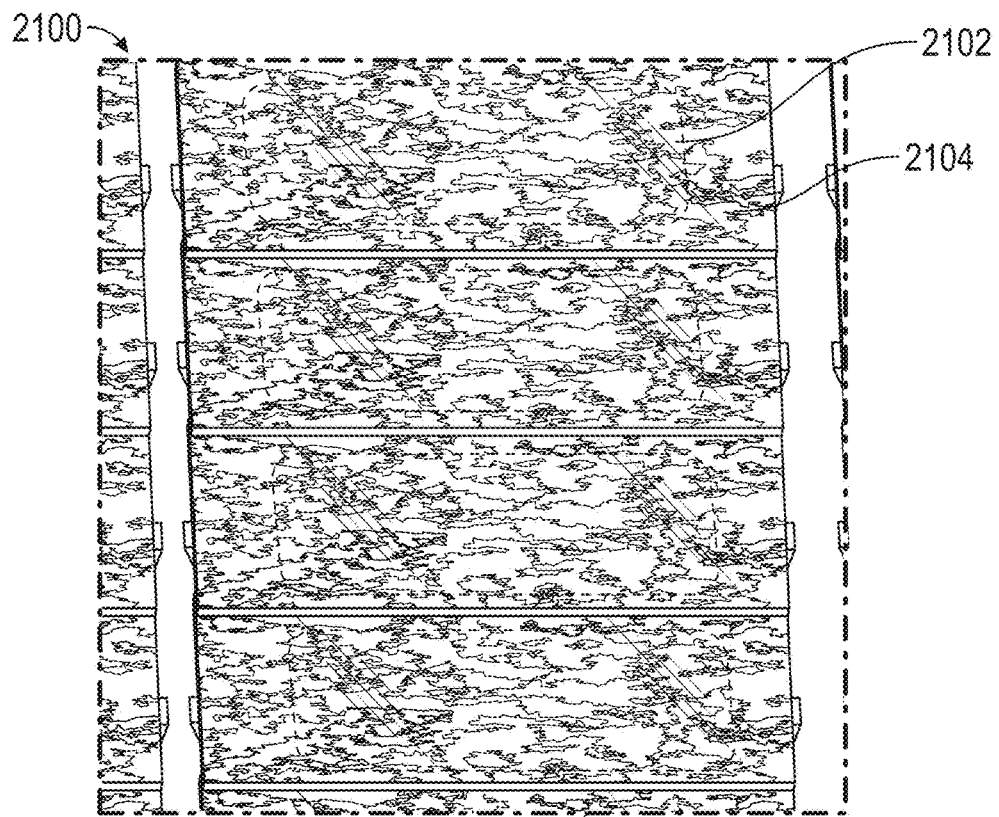
FIG. 21A is a solar tile that comprises a camouflage film according to one or more embodiments.
Figure 21B:
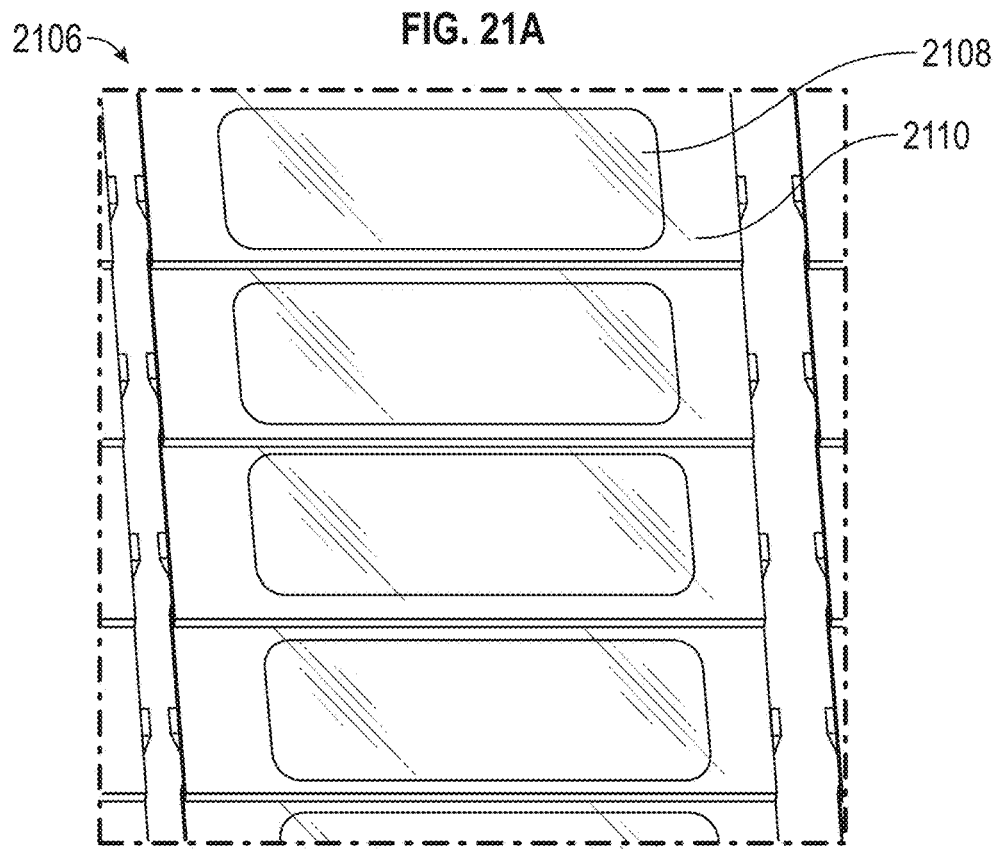
FIG. 21B is a solar tile that does not comprise a camouflage film according to one or more embodiments.
Figure 22A:
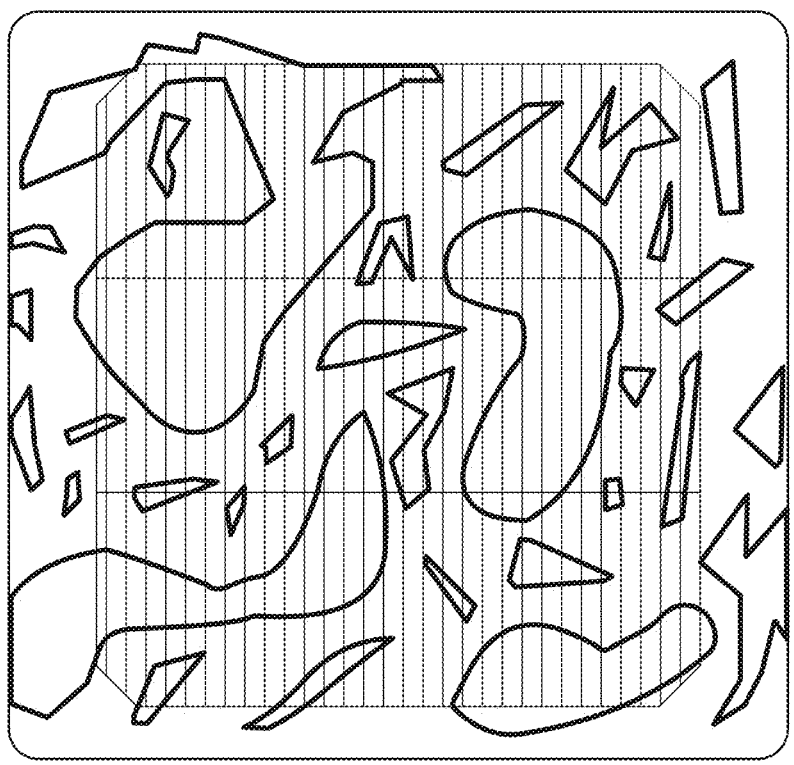
FIG. 22A-22D are solar tiles with a camouflage film according to one or more embodiments.
Figure 22B:
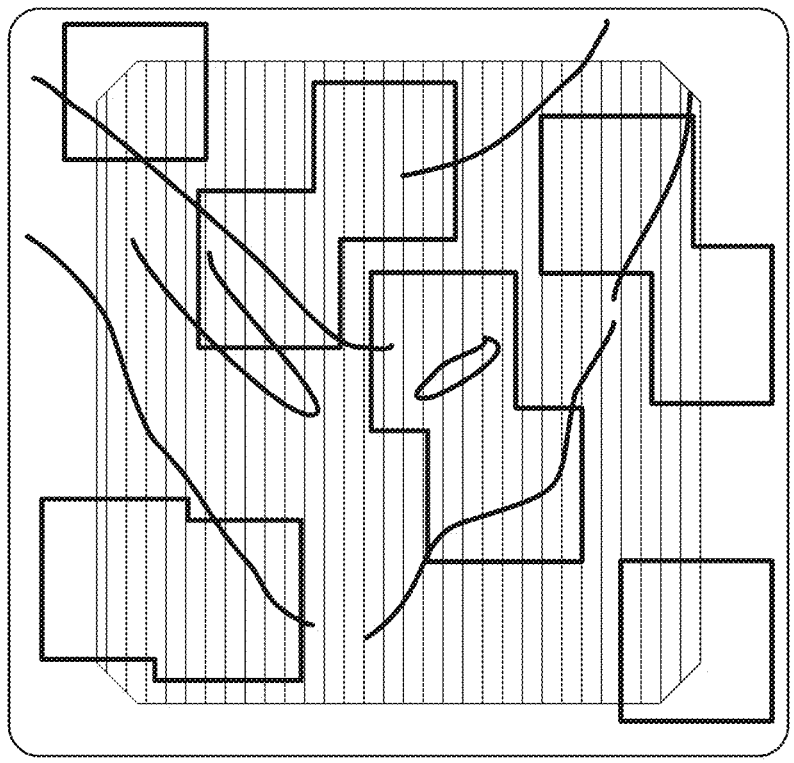
Figure 22C:
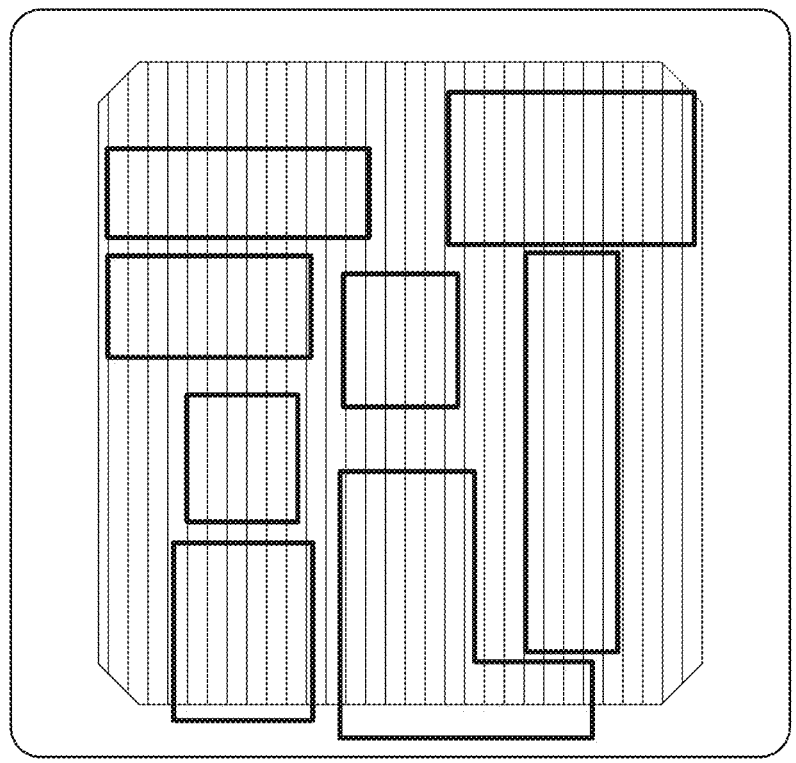
Figure 22D:
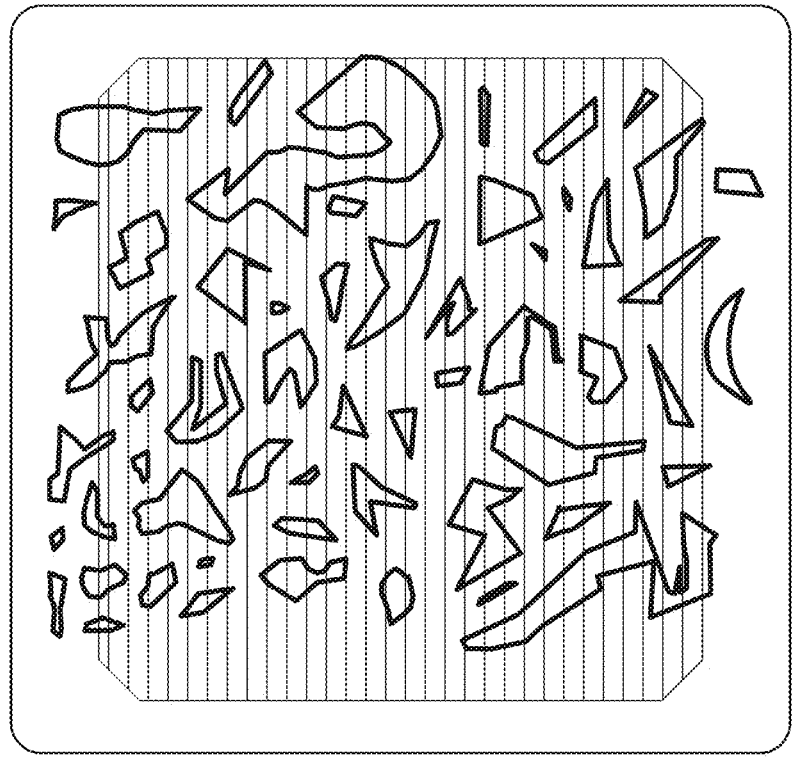

FIG. 21A shows an example of a coating with a camouflage pattern that is applied to the solar cells 2102, according to embodiments of the present disclosure. The camouflage pattern obscures the solar cells 2102 from the surrounding material and makes the solar tile 2100 appear to be more uniform in appearance (e.g., it is difficult to observe where the traditional roofing material 2104 stops and the solar cell 2102 begins). FIG. 21B illustrates solar cells 2108 without a camouflage film. The solar cells 2108 are visible (towards the middle of each solar tile 2106).

In certain embodiments, a textured substrate may be used to further enhance the obscuring effects of the patterned film. FIGS. 22A-22D illustrate exemplary camouflage coatings formed on a textured substrate according to certain embodiments of the present disclosure. The texturing may comprise raised or depressed lines in a certain direction, raised or depressed square patterns, pebbling, or other texturing.

B. Backsheet With Cell Color Matching

Another way to obscure the cells within the solar tiles is by matching the backsheet color to the silicon wafer of the photovoltaic and/or creating a textured backsheet, according to certain embodiments of the present disclosure.

Figure 23:
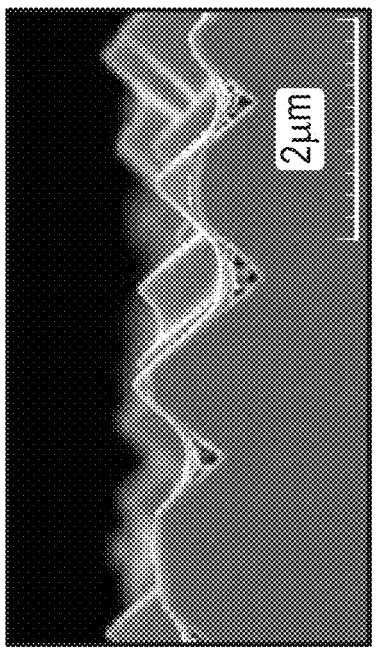
FIG. 23 is a series of micrographs that show the topography of a silicon wafer.
Figure 23:
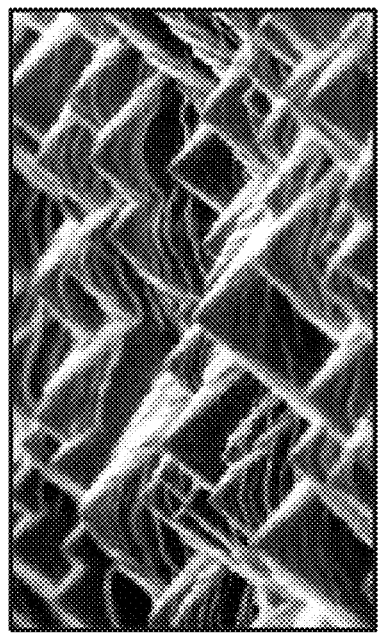
Figure 23:
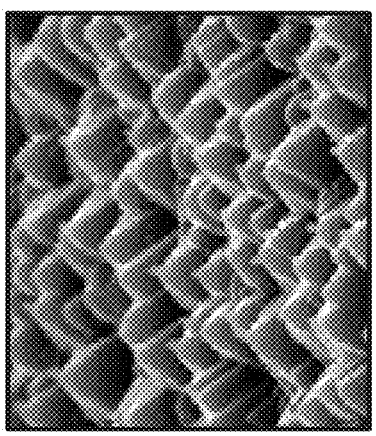
Figure 23:
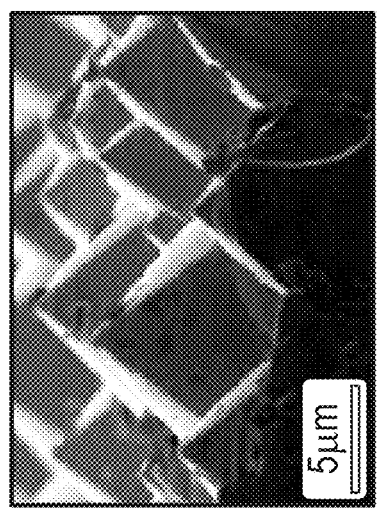
Figure 23:
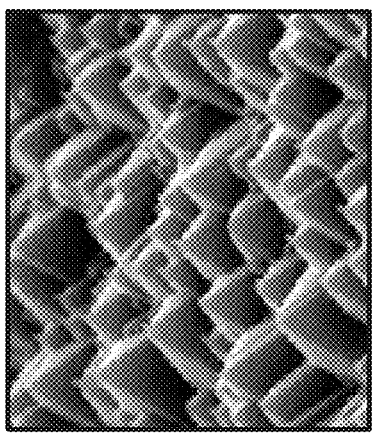
Figure 23:
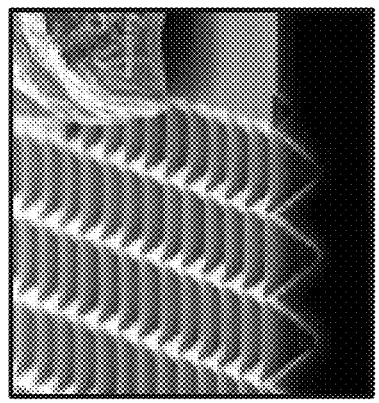

In some embodiments, the silicon wafer surface includes a pyramidal topography. FIG. 23 illustrates the microstructure of the silicon surface in a series of electron micrographs. The pyramidal topography may result when the silicon (e.g., Si(111)) surface is the exposed face. The topography of the silicon surface may be different if a different silicon surface, such as the Si(110) or the Si(100) surface is exposed. Similarly, the topography may be different if the photovoltaic comprised another semiconductor, such as gallium nitride, gallium arsenide, gallium phosphide, or another semiconductor.

According to some embodiments of the present disclosure, the backsheet comprises a textured polymer layer, such as PET, Polycarbonate, or another suitable polymer. The textured polymer layer may have a pyramidal topography, similar to the structures exhibited in the Si(111) surface shown in FIG. 23. A coating may then be applied to the top of the textured polymer layer. In some embodiments, the coating layer has a similar color (or array of colors) compared to the cell (or specifically the silicon wafer or photovoltaic). The result of the coating/film on top of the polymer backsheet is a film that matches the very complex color behavior observed when looking at a traditional cell and silicon wafer. If the topography of the silicon is different, for example, it contains cubic features, then the backsheet may comprise similar features (instead of pyramidal features). In certain embodiments, the backsheet may comprise a glass or other transparent material that need not be a polymeric material.

A textured polymer (such as PET) backsheet may be synthesized using a number of techniques. For example, a textured backsheet can be synthesized using a polymer injection method in which a master mold is first created. Using such a method, a master mold is created. This master may be a metal master formed by taking a metal blank and then laser cutting (or otherwise forming, such as through etching) the desired features into the metal blank. For example, pyramidal features may be laser cut or otherwise formed in the metal blank. Alternatively, the master may be a glass master formed by laser cutting or using other deposition or etching techniques, such as electroforming. The master may also be formed according to other techniques known to persons of skill in the art. The resulting master will contain a negative impression of the features, for example a pyramidal feature in the resulting film will appear as a pyramidal pit in the master.

According to certain embodiments, other mold "parents" may be created with both positive and negative impressions in order to allow for the further creation of additional masters that will be used to produce the textured polymer backsheet. That is, a "parent" mold that contains the negative impression of the features may be used to create one or more "other parent" molds with positive impressions of the features to be formed in the textured polymer backsheet. The one or more "other parent" molds with the positive impressions may be used to create one or more negative master molds that are then used to form the textured polymer backsheet. Creating "parent" and "other parent" molds is desirable in certain instances because they allow for the creation of other master molds that are used to form the textured polymer backsheet, which may be necessary if a master mold is lost, or the features deteriorate from use. Additional master molds may also be created when increasing production.

After a master mold has been created, it may be used to form the textured polymer backsheet. For example, the master mold may be used as part of a polymer-injection-molding process to form the textured polymer backsheet. The master mold may be inserted into an enclosure (for example a die) and molten polymer (or other material) poured into the die and allowed to dry. The textured backsheet will have the positive features, such as pyramidal features, similar to the silicon shown in FIG. 23. The textured polymer backsheet may be tested for quality standards.

In some embodiments, polydimethylsiloxane (PDMS) soft lithography may be used to create the master molds and the textured polymer backsheet. Other fabrication techniques may be used to create the mater mold and textured polymer backsheet. In some embodiments, the resulting textured polymer backsheet contains the desired surface features (e.g., surface features that match the surface topography of the glass surface). In certain embodiments, instead of a polymer (such as PET) backsheet, glass (silica or another transparent material) is used as the backsheet substrate.

Figure 24:
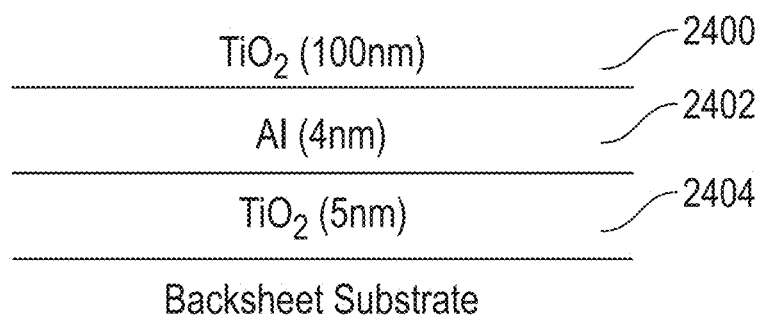
FIG. 24 is a sectional side view illustrating a laminated backsheet according to one or more embodiments.

The backsheet substrate (textured or otherwise) may be coated with one or more layers to create a specific color profile that helps to visually obscure the cell, and specifically the silicon wafer (or wafer formed of other semiconductor material) of the photovoltaic cell. The coating on top or on the bottom of the backsheet substrate may consist of one or more layers. The entire surface of the backsheet substrate need not be coated. Optionally, the total surface area of the backsheet substrate is coated between 10% to 90%. The coating layers may be formed with PVD or another technique known to persons of skill in the art. The PVD or other technique forms the required coating thickness and is compatible with the materials in the coating. For example, Ti, Zn, Si, Al, Sn, In, Cu, Zr, Nb, Sb oxides or nitrides may be used as one or more of the layers formed on the backsheet substrate. Other layers may include metals such as Nb, Ag, Cu, Fe, Cr, Ni, Al, Ti alone or in combination. For example, FIG. 24 illustrates coating layers 2400 ($TiO_2$), 2402 (Al), and 2404 ($TiO_2$) according to certain embodiments. The $TiO_2$/Al/$TiO_2$ layers (in the thicknesses shown in FIG. 24, specifically, 100 nm/4 nm/5 nm) produce a purplish color. In some embodiments, the coating includes a layer of Si on the substrate and either a layer of indium tin oxide (ITO) on the Si layer (e.g., substrate/Si/ITO) or a layer of $Si_3N_4$ on the Si layer (e.g., substrate/Si/$Si_3N_4$). Optionally, the entire backsheet is textured. In some embodiments, the textured backsheet is used to mimic an actual wafer (e.g., to act as a fake wafer with the same color as the actual wafer). The coating layers may comprise silicone based coatings or solvent based ink systems.

Pattern coatings, pattern coatings over a textured substrate, a textured backsheet, and a coated backsheet may all be used together to help obscure the solar cell from view and cause it to blend into its environment (such as the rest of the solar tile), thereby obscuring or camouflaging the solar cell.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed system, method, and computer program product. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure.

As used herein, the terms "comprises," "comprising," "includes," "including," "has," "having" or any contextual variants thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Further, unless expressly stated to the contrary, "or" refers to an inclusive or and not to an exclusive or. For example, a condition "A or B" is satisfied by any one of the following: A is true (or present) and B is false (or not present), A is false (or not present) and B is true (or present), and both A and B is true (or present).

Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, reversed, or otherwise controlled by another process.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted.

What is claimed is:

1. A solar panel comprising:
a backsheet layer;
a bottom encapsulant layer adjacent the backsheet layer;
a plurality of photovoltaic cells adjacent the bottom encapsulant layer;
a top encapsulant layer adjacent the plurality of photovoltaic cells, the top encapsulant layer having a plurality of louvers constructed in the top encapsulant layer to block side view of the plurality of photovoltaic cells; and
a top layer adjacent the top encapsulant layer, wherein a surface of the top layer includes a saw tooth pattern, the saw tooth pattern including a plurality of teeth having vertical tooth surfaces and angled tooth surfaces, wherein the vertical tooth surfaces include black coloring to obscure the view of the plurality of photovoltaic cells from a side angle.

2. The solar panel of claim 1, wherein the plurality of louvers are distributed across the top encapsulant layer.

3. The solar panel of claim 2, wherein the plurality of louvers includes differing incident angles across the top encapsulant layer.

4. The solar panel of claim 2, wherein a first group of the plurality of louvers have a first incident angle and a second group of the plurality of louvers have a second incident angle that differs from the first incident angle.

5. The solar panel of claim 1, wherein the plurality of louvers comprises a design color that cause the solar panel to have the appearance of the design color when viewed from a side angle.

6. The solar panel of claim 5, wherein:
the solar panel has the design color when viewed from the side angle; and
the solar panel has a differing color when viewed from other than the side angle.

7. The solar panel of claim 1, wherein the vertical tooth surfaces are substantially perpendicular to the solar panel and the angled tooth surfaces are formed at an angle that is between perpendicular to the solar panel and parallel to the solar panel.

8. The solar panel of claim 1, wherein the vertical tooth surfaces are substantially opaque and the angled tooth surfaces are substantially transparent such that the top layer is substantially transparent when viewed from an angle approximately perpendicular to the solar panel and substantially opaque when viewed from the side angle.

* * * * *